(12) United States Patent
Shinozaki

(10) Patent No.: US 8,807,914 B2
(45) Date of Patent: Aug. 19, 2014

(54) SEAL DEVICE AND METHOD FOR OPERATING THE SAME AND SUBSTRATE PROCESSING APPARATUS COMPRISING A VACUUM CHAMBER

(75) Inventor: Hiroyuki Shinozaki, Kanagawa-ken (JP)

(73) Assignee: Ebara Corporation, Tokyo (JP)

( * ) Notice: Subject to any disclaimer, the term of this patent is extended or adjusted under 35 U.S.C. 154(b) by 610 days.

(21) Appl. No.: 12/285,489

(22) Filed: Oct. 7, 2008

(65) Prior Publication Data

US 2009/0067977 A1 Mar. 12, 2009

Related U.S. Application Data

(60) Continuation of application No. 11/698,061, filed on Jan. 26, 2007, which is a division of application No. 10/404,065, filed on Apr. 2, 2003, now Pat. No. 7,232,286.

(30) Foreign Application Priority Data

Apr. 5, 2002 (JP) .................. 2002-103947
Aug. 30, 2002 (JP) .................. 2002-254082

(51) Int. Cl.
  *B65H 1/00* (2006.01)
  *C23C 16/00* (2006.01)
  *C23F 1/00* (2006.01)
  *F01D 11/00* (2006.01)

(52) U.S. Cl.
  USPC ........... 414/805; 414/217; 414/935; 414/939; 414/941; 118/719; 118/733; 156/345.31; 156/345.32; 277/301; 277/409; 277/411

(58) Field of Classification Search
  USPC .......... 118/733, 719; 414/805, 217, 935, 939, 414/941; 277/301, 409, 411; 156/345.31, 156/345.32
  See application file for complete search history.

(56) References Cited

U.S. PATENT DOCUMENTS

| 4,726,689 A | 2/1988 | Pollock |
| 4,749,283 A | 6/1988 | Yokomatsu et al. |
| 4,812,101 A | 3/1989 | George et al. |
| 4,822,182 A | 4/1989 | Matsushita et al. |
| 5,218,896 A | 6/1993 | Furukawa |
| 5,913,978 A | 6/1999 | Kato et al. |

(Continued)

FOREIGN PATENT DOCUMENTS

| EP | 0 838 835 A2 | 4/1998 |
| JP | 2-212624 A | 8/1990 |

(Continued)

OTHER PUBLICATIONS

Japanese Office Action dated Oct. 5, 2007 issued in corresponding Application No. 2002-254082.

(Continued)

*Primary Examiner* — Karla Moore
(74) *Attorney, Agent, or Firm* — Westerman, Hattori, Daniels & Adrian, LLP

(57) ABSTRACT

The present invention provides a seal device comprising a sealing passage which allows communication between a first space and a second space, and evacuation lines individually connected to the first space and the sealing passage. A gas feed line for feeding dry gas is connected to the sealing passage.

7 Claims, 15 Drawing Sheets

(56) References Cited

U.S. PATENT DOCUMENTS

| | | |
|---|---|---|
| 6,305,895 B1 | 10/2001 | Ozawa et al. |
| 6,708,981 B2 * | 3/2004 | Hall et al. .................. 277/431 |
| 6,805,487 B1 | 10/2004 | Yuasa et al. |
| 2002/0002946 A1 | 1/2002 | Tanaka et al. |
| 2004/0187786 A1 | 9/2004 | Tanaka et al. |

FOREIGN PATENT DOCUMENTS

| | | | |
|---|---|---|---|
| JP | 8-148539 A | 6/1996 |
| JP | 11-045925 A | 2/1999 |
| JP | 2000-3955 A | 1/2000 |
| JP | 2001-070781 A | 3/2001 |
| JP | 2002-025890 A | 1/2002 |

OTHER PUBLICATIONS

European Search Report dated Aug. 5, 2010, issued in corresponding European Patent Application No. 03007399.3.

* cited by examiner

PRESSURE RELATIONSHIP WITH RESPET TO VACUUM CHAMBER, CHAMBER OR SPACE, AND VACUUM GROOVES OF DIFFERENTIAL VACUUM SEAL DEVICE

SEAL DEVICE AND METHOD FOR OPERATING THE SAME AND SUBSTRATE PROCESSING APPARATUS COMPRISING A VACUUM CHAMBER

CROSS-REFERENCE TO RELATED APPLICATIONS

This application is a continuation of U.S. patent application Ser. No. 11/698,061, filed on Jan. 26, 2007, which is a divisional of U.S. patent application Ser. No. 10/404,065, filed on Apr. 2, 2003, the entire contents of which are incorporated herein by reference.

BACKGROUND OF THE INVENTION

The present invention relates to a seal device for providing a seal between two spaces having different pressures, and to a method for operating the same, and also relates to a substrate processing apparatus comprising a vacuum chamber. More specifically, the present invention relates to a non-contacting seal device capable of providing a suitable seal in a semiconductor manufacturing apparatus between two spaces having different pressures and method for operating the same, and also relates to a substrate processing apparatus comprising a vacuum chamber in which a stage device is provided, wherein a substrate for producing a semiconductor or a liquid crystal is loaded on the stage device and processed in the vacuum chamber. In the substrate processing apparatus of the present invention, the vacuum chamber is appropriately controlled so that a good vacuum environment produced in the vacuum chamber can be maintained.

Conventional non-contacting seal devices for providing a seal between spaces having different pressures are disclosed in U.S. Pat. Nos. 4,118,042, 4,191,385 and 4,425,508. The seal devices disclosed in the above documents are used in a clean environment, such as a vacuum environment, in which a movement (a rotary motion or a linear motion) of an object is effected. The purpose of using these seal devices is to effect a high-speed or smooth movement of the object without any risk of contamination of the clean environment.

Non-contacting seal devices tend to be used in the following two cases: when an object to be moved and a minimal structure are provided in a clean environment and a drive source and a guide mechanism for moving the object are provided outside the clean environment; and when a non-contact type bearing such as a static fluid bearing (e.g., an air bearing) is provided and a clean environment is sealed without reducing the merit of the non-contact type bearing. In the latter, (1) the static fluid bearing is provided within a clean environment, and the clean environment is sealed against fluid of the static fluid bearing, or (2) the bearing is provided outside a clean environment, and a non-contacting seal is provided between the clean environment and an external environment.

A characteristic of a non-contacting seal device is that it is able to separate two spaces in a non-contacting manner. In an individual apparatus to which a non-contacting seal device is applied (hereinafter, frequently referred to simply as "the apparatus"), such a characteristic of a non-contacting seal device is a merit when the seal device performs a sealing function in a normal operating condition. However, pressure conditions of the apparatus are subject to change at a time of starting or stopping the seal device or after stopping the seal device, depending on the method employed for operating the seal device. From the viewpoint of a time required for starting the individual apparatus, a risk of contamination when stopping the apparatus and maintaining a desired degree of cleanliness, it is necessary to take into account a way in which the apparatus is affected by the method for operating the seal device.

Referring to FIG. 1, explanation is made with regard to how the apparatus is affected by the method for operating the seal device, at the time of starting or stopping the seal device and after stopping the seal device. First, explanation is made with regard to the apparatus at the time of starting the seal device. As shown in FIG. 1, the seal device comprises a sealing passage 3 having a small cross-sectional area which connects a first space 1 and a second space 2. In an initial state, the first space 1, the second space 2 and the sealing passage 3 are maintained at the same pressure, for example, at atmospheric pressure. The first space 1 is a vacuum chamber which is to be brought into a high-vacuum condition for, for example, processing a substrate for manufacturing a semiconductor device. The second space 2 accommodates a transport mechanism for transporting substrates, and has a low degree of cleanliness as compared to the first space 1. The second space 2 may be an atmospheric environment in a clean room. In this state, the seal device is started. However, the following problems may arise, depending on the method used for starting the seal device.

[Case 1]

In CASE 1, initially, a vacuum pump 41 in an evacuation line L1 is actuated and a valve 51 is opened, to thereby start evacuation through the evacuation line L1. Subsequently, a vacuum pump 42 in an evacuation line L2 is actuated and a valve 52 is opened, to thereby start evacuation through the evacuation line L2. In a normal operating condition of the seal device, the pressure relationship between the first space 1, the second space 2 and the sealing passage 3 is represented by P1<P3<P2 (in terms of a degree of vacuum, V1>V3>V2), wherein P1, P2 and P3 represent the pressures in the first space 1, the second space 2 and the sealing passage 3, respectively, and V1, V2 and V3 represent the degrees of vacuum in the first space 1, the second space 2 and the sealing passage 3, respectively. In a transient state after the start of evacuation through the evacuation line L1 by opening the valve 51, the relationship P1<P3<P2 or P1<P3=P2 (for example, P1 is several Torr, P3 is a value between atmospheric pressure and several hundred Torr and P2 is atmospheric pressure) is established. In this state, a considerable amount of gas flows from the second space 2 into the first space 1.

Thereafter, when evacuation through the evacuation line L2 is started by opening the valve 52, most of the gas flowing from the second space 2 is introduced into the evacuation line L2 and does not flow into the first space 1. Consequently, the pressure relationship P1<P3<P2 in a normal operating condition (for example, P1 is 1E-6 Torr, P3 is 1E-3 Torr and P2 is atmospheric pressure) is established, and the seal device starts to operate in a normal operating condition.

Thus, in the above operation for starting the seal device, a considerable amount of gas flows from the second space 2 into the first space 1. Therefore, the degree of cleanliness of the first space 1 lowers. For example, when air having a humidity of 50% flows from the second space 2 into the first space 1, the ultimate degree of vacuum in the first space 1 lowers. Further, if the second space 2 contains foreign matter, such matter will enter a small gap in the sealing passage 3, and clog the sealing passage 3. The gap provided in the sealing passage 3 is generally 1 mm or less. Recently, a high-performance seal device adapted for sealing a gap as small as 0.005 mm (=5 μm) has also been made available.

[Case 2]

In CASE 2, the vacuum pump 42 is first actuated and the valve 52 is opened, to thereby start evacuation through the evacuation line L2. Subsequently, the vacuum pump 41 is actuated and the valve 51 is opened, to thereby start evacuation through the evacuation line L1. The pressure relationship in a normal operating condition is P1<P3<P2 (in terms of a degree of vacuum, V1>V3>V2). In a transient state after the start of evacuation through the evacuation line L2 by opening the valve 52, the relationship P1>P3<P2 (for example, P1 is several hundred Torr, P3 is several Torr and P2 is atmospheric pressure) is established. Therefore, a gas flows from the second space 2 into the sealing passage 3.

Subsequently, evacuation through the evacuation line L1 is started by opening the valve 51. In this instance, a slight amount of gas flows from the second space 2 into the first space 1. Then, the pressure relationship in a normal operating condition, that is, P1<P3<P2 (for example, P1 is 1E-6 Torr, P3 is 1E-3 Torr and P2 is atmospheric pressure), is established, thus completing the starting operation. During the starting operation, there is a possibility that foreign matter contained in the second space 2 may become mixed in the gas flow and clog the small gap in the sealing passage 3.

Next, explanation is made with regard to problems arising due to a sequence of steps conducted for stopping the seal device. Initially, a differential exhausting sealing function is performed in a normal operating condition. The pressure relationship in this condition is P1<P3<P2 (in terms of a degree of vacuum, V1>V3>V2). For example, P1 is 1E-6 Torr, P3 is 1E-3 Torr and P2 is atmospheric pressure.

[Case 3]

In CASE 3, the valve 51 and the valve 52 are closed at the same time. In this case, the first space 1 is subject to a phenomenon that a crack such as a sealing passage 3 is created in a wall defining a vacuum chamber. That is, a gas in the second space 2 vigorously flows through the sealing passage 3 into the first space 1. Thus, a considerable amount of gas flows from the second space 2 into the first space 1, thus lowering a degree of cleanliness of the first space 1. For example, when air having a humidity of 50% flows from the second space 2 into the first space 1, the ultimate degree of vacuum in the first space 1 lowers. Further, if the second space 2 contains foreign matter, such matter will enter a small gap in the sealing passage 3, and clog the sealing passage 3.

[Case 4]

In CASE 4, the valve 52 is first closed, and then the valve 51 is closed. In this case also, the first space 1 is subject to a phenomenon that a crack such as a sealing passage 3 is created in a wall defining the vacuum chamber. That is, a gas in the second space 2 vigorously flows through the sealing passage 3 into the first space 1. This imparts to the vacuum pump 41, which draws a high vacuum in the first space 1, an effect similar to that of entry of the atmosphere. When use is made of a turbomolecular pump, of which turbine blades are rotated at ultrahigh speed and strike molecules, an excessive amount of external force acts on the blades, thus resulting in the possibility of breakage of the blades.

Thus, in CASE 4, a considerable amount of gas flows from the second space 2 into the first space 1, thus lowering the degree of cleanliness of the first space 1. For example, when air having a humidity of 50% flows from the second space 2 into the first space 1, the ultimate degree of vacuum in the first space 1 lowers. Further, if the second space 2 contains foreign matter, such matter will enter a small gap in the sealing passage 3, and clog the sealing passage 3.

[Case 5]

When the valve 51 is first closed and the valve 52 is then closed, a considerable amount of gas flows from the second space 2 into the first space 1 through the gap in the sealing passage 3 until the pressure relationship P1=P3 or P1>P3 is established. Therefore, the degree of cleanliness of the first space 1 lowers. For example, when air having a humidity of 50% flows from the second space 2 into the first space 1, the ultimate degree of vacuum in the first space 1 lowers. Further, if the second space 2 contains foreign matter, such matter will enter a small gap in the sealing passage 3, and clog the sealing passage 3.

Next, explanation will be made with regard to how the apparatus is affected by the sealing passage 3 after stopping the seal device.

[Case 6]

In each of CASES 3, 4 and 5, a gas flows from the second space 2 into the first space 1. If such a state is permitted, the first space 1 will be brought into a state similar to that of a vacuum chamber opened and exposed to a gas in an external environment, such as air in a clean room. In this case, if the air in a clean room is a moist gas having a humidity of about 50%, an inner surface of a wall defining the first space 1 is exposed to such a moist gas. Therefore, the ultimate degree of vacuum in the first space 1 when reproducing a vacuum becomes low. In other words, it is difficult to achieve the degree of vacuum for which the apparatus is set, and therefore the time for restarting the apparatus is markedly prolonged.

[Case 7]

When dry gas is fed into the first space 1 in order to maintain the pressures in the first space 1 and the second space 2 at the same level, because the first space 1 and the second space 2 are communicated through the sealing passage 3, if the gas in the second space 2 has a high humidity, the humidity of the entire space including the first space 1 and the second space 2 moves towards a state of equilibrium. That is, the gas in the first space 1 acts like a dry sponge absorbing a water component of the gas occupying the second space 2. Consequently, water is adsorbed on the inner wall surface defining the first space 1. Therefore, the ultimate degree of vacuum in the first space 1 when reproducing a vacuum becomes low. In other words, it is difficult to achieve the degree of vacuum for which the apparatus is set, and therefore a time for restarting the apparatus is markedly prolonged.

After stopping the seal device, if the first space 1 is filled with air having a humidity of 50% and the apparatus is restarted 1 day after stopping of the seal device, an operation for reproducing a vacuum must be conducted for 1 month to achieve a set degree of vacuum in the first space 1.

Generally, in a substrate processing apparatus, a substrate is loaded on a stage device, and moved so that a specific region on the substrate's surface is located at a predetermined position and processed.

The stage device includes a movable base and a stationary base, and a guide element and a drive element. To move a substrate loaded on the movable base, a control command is applied to the drive element, which imparts a thrust force to the movable base. Thus, the movable base is moved, while being guided by the guide element.

As a guide element, a rolling guide element has been conventionally used. The rolling guide element requires use of a lubricant, and an effective means to suppress generation of dust and a release of gas accompanying a rolling motion of the guide element is studied.

As a drive element, a rotary motor or a linear motor, which converts electric energy to kinetic energy, is employed. A rotary motor is used in combination with a magnetic fluid seal. This combination has a merit such that the motor can be provided outside a vacuum chamber in which a substrate is provided. That is, the motor can be used in an atmospheric environment, and the type of the motor can therefore be selected from a wide range.

However, the use of a rotary motor in combination with a magnetic fluid seal has a demerit such that (a) the life of the magnetic fluid seal becomes short. The life of the magnetic fluid seal is in inverse proportion to the degree of vacuum. That is, the higher the degree of vacuum created in the vacuum chamber, the shorter the life of the magnetic fluid seal. Another demerit is that (b) it is essential to provide a mechanism for converting a rotary motion to a linear motion. Thus, it is not possible to effect a smooth linear motion due to rattling or friction of the converting mechanism.

Therefore, in recent years, there has been an increasing tendency to use a linear motor, which does not require use of a converting mechanism, and therefore has no demerit (b). However, there is no vacuum seal suitable for use with a linear motor. Therefore, it has been desired to employ a linear motor which can be suitably used within a vacuum environment, that is, one which is free from problems, such as (c) a release of gas, (d) generation of heat and (e) generation of dust. However, the problems of a release of gas and generation of heat cannot be completely avoided in practice. Therefore, a conventional substrate processing apparatus such as that shown in FIG. 2 is employed.

In FIG. 2, reference $1a$ denotes a first space or vacuum chamber; 2 a second space or vacuum chamber; 4 a housing defining the first and second vacuum chambers 1 and 2; $3a$ a passage formed by a wall 6 between the first vacuum chamber 1 and the second vacuum chamber 2; 11 a stage device provided in the first vacuum chamber 1 and comprising a stationary base 12 and a movable base 13 movably supported on the stationary base 12 by a rolling mechanism 14; 15 a drive device provided in the second vacuum chamber 2 and connected to the movable base 13 through a connecting member 16 extending through the passage $3a$; and 17 an electron beam generating column for processing a substrate S loaded on the movable base 13. The passage $3a$ provides a restricted portion which connects the first space or vacuum chamber $1a$ and the second space or vacuum chamber $2a$. The first vacuum chamber $1a$ and the second vacuum chamber $2a$ are evacuated by means of individual vacuum pumps 18 and 19, such as ion pumps. The pressure in the first vacuum chamber $1a$ and the pressure in the second vacuum chamber $2a$ are controlled so as to satisfy the relationship $P1<P2<P0$, wherein P1 and P2 represent the pressure in the first vacuum chamber $1a$ and the pressure in the second vacuum chamber $2a$, respectively, and P0 represents atmospheric pressure. (If P1, P2 and P0 are replaced by the corresponding degrees of vacuum DV1, DV2 and DV0, the relationship $DV1>DV2>DV0$ is established.) The purpose of this arrangement is to protect the first vacuum chamber $1a$ from gas, heat and dust generated from the drive element. It should be noted that in the present specification, the term "a vacuum chamber" does not mean a chamber in an absolute vacuum, but rather a chamber having a low pressure such as that which is referred to as a "vacuum" in the related art.

FIG. 3 shows another example of a conventional substrate processing apparatus. In FIG. 3, the same parts or portions as those shown in FIG. 2 are designated by the same reference numerals as used in FIG. 2, and explanation thereof is omitted. In the substrate processing apparatus in FIG. 3, a bellows type seal device 21 is provided in a passage 5 which corresponds to the passage $3a$ forming the restricted portion in FIG. 2, so as to prevent a flow of gas from the second vacuum chamber $2a$ to the first vacuum chamber $1a$. However, a reaction force and vibrations produced by expansion and contraction of the bellows interfere with a smooth movement of a substrate. This can be avoided by using a fluorine resin, which is flexible and can be suitably used in a vacuum condition, for the bellows. When a difference between the pressures P1 and P2 is small, even a bellows made of a flexible material is capable of serving as a pressure bulkhead.

FIG. 4 shows a further example of a conventional substrate processing apparatus. In FIG. 4, the same parts or portions as those shown in FIGS. 2 and 3 are designated by the same reference numerals as used in FIGS. 2 and 3, and explanation thereof is omitted. In the substrate processing apparatus of FIG. 4, the second space is changed from a vacuum chamber $2a$ shown in FIG. 2 to an atmospheric environment under atmospheric pressure P0 in which the drive device 15 (such as a linear motor) is disposed. Since the second vacuum chamber $2a$ is replaced with an atmospheric environment, the bellows type seal device 21 which also serves as a pressure bulkhead is required to withstand a differential pressure as high as 1 kg/cm$^2$. Therefore, a bellows made of a flexible material such as a fluorine resin cannot be used, and effects of a reaction force and vibrations produced by a bellows cannot be avoided. However, a countermeasure for generation of heat by the drive element (i.e., cooling) can be easily taken, and a vacuum system having a simple construction can be employed.

FIG. 5 shows a further example of a conventional substrate processing apparatus. In FIG. 5, the same parts or portions as those shown in FIGS. 2 to 4 are designated by the same reference numerals as used in FIGS. 2 to 4, and explanation thereof is omitted. In FIG. 5, the drive device 15 (such as a linear motor) is provided in an atmospheric environment, and a non-contacting seal device (a differential exhausting or vacuum seal device) 25 is provided in the passage $3a$ in which the connecting member 16 connecting the stage device 11 and the drive device 15 extends. The non-contacting seal device 25 provides a seal between the first vacuum chamber 1 and the atmospheric environment. The non-contacting seal device 25 comprises a plurality of (three in this embodiment) vacuum grooves 26 formed in an inner circumferential surface of the wall 6 in the passage $3a$. The vacuum grooves 26 are individually connected to evacuation lines. The vacuum grooves 26 are evacuated through the evacuation lines so as to produce individual vacuum pressures P3, P4 and P5 in the vacuum grooves 26 so that the relationship $P0>P3>P4>P5>P1$ is established (if P0, P3, P4, P5 and P1 are replaced by the corresponding degrees of vacuum DV0, DV3, DV4, DV5 and DV1, the relationship $DV0<DV3<DV4<DV5<DV1$ is established). In this arrangement, there is no need to evacuate the second space $2a$, and the apparatus can be reduced in size. Further, the non-contacting seal device 25 is employed, instead of the bellows type seal device 21 in FIG. 4. Therefore, the problems of a reaction force and vibrations produced by expansion and contraction of the bellows can be avoided.

In this arrangement, however, when the non-contacting seal device 25 stops operating, atmospheric pressure is introduced into the first vacuum chamber 1 through the passage $3a$, so that the pressure in the first vacuum chamber 1 becomes substantially equal to atmospheric pressure. That is, the vacuum of the first vacuum chamber 1 cannot be maintained. Therefore, when the apparatus stops operating in the event of emergency, for example, a power failure, a vacuum must be reproduced in the first vacuum chamber $1a$, and the time required for reproducing a vacuum becomes considerably long, depending on the characteristics of the gas flowing into the first vacuum chamber 1.

Therefore, a substrate processing apparatus as shown in FIG. 6 is proposed. The apparatus of FIG. 6 comprises a first space or vacuum chamber 1a in which the stage device 11 is provided, and a second space or chamber 7 (pressure: P7) in which the drive device 15 (such as a linear motor) is provided. The space 7 is separated from an ambient atmosphere by a cover 8 and from the first vacuum chamber 1a by the wall 6 and the non-contacting seal device (differential exhausting seal device) 25. The non-contacting seal device 25 is provided in the passage 3a in which the connecting member 16 connecting the stage device 11 and the drive device 15 extends. The non-contacting seal device 25 in FIG. 5 has the same structure and performs the same function as the non-contacting seal device 25 shown in FIG. 4. A plurality of (three in this embodiment) vacuum grooves 26 are formed in the inner circumferential surface of the wall 6 in the passage 4 and are individually connected to the evacuation lines L6-1, L6-2 and L6-3. The vacuum grooves 26 are evacuated so as to produce individual vacuum pressures P3, P4 and P5, which satisfy the relationship P7>P6-3>P6-2>P6-1>P1 (if P7, P3, P4, P5 and P1 are replaced by the corresponding degrees of vacuum DV7, DV3, DV4, DV5 and DV1, the relationship DV7<DV3<DV4<DV5<DV1 is established). In this arrangement, atmospheric pressure is not directly introduced into the first vacuum chamber 1, even when the non-contacting seal device 25 stops operating.

In the above-mentioned arrangements, the movable base 13 of the stage device 11 is movably supported by the rolling mechanism 14. Theoretically, it is impossible to prevent generation of dust in the rolling mechanism 14.

Therefore, in a substrate processing apparatus shown in FIG. 7, a stage device 31 having no rolling mechanism is provided. A movable base 33 of the stage device 31 is supported, on one side, by the connecting member 16, while the connecting member 16, and hence the movable base 33, are supported by using a non-contacting type guide element [such as a static bearing (an air bearing)] 35. The non-contacting type guide element 35 is provided in the passage 3a at a position adjacent to the non-contacting seal device 25 and on a side of the drive device 15. Thus, there is no problem of generation of dust. Further, because the non-contacting seal device 25 is used, it is possible to avoid generation of dust in a seal portion, and problems of a reaction force and vibrations produced by a bellows can also be avoided. In the arrangement of FIG. 7, the space in which the drive device 15 is placed is an atmospheric environment. The movable base 33 of the stage device 31 is supported on one side, but this does not limit the arrangement of FIG. 7. Incidentally, in the arrangement of FIG. 7, relative horizontal positions of a reflecting mirror 41 provided on the movable base 33 on which the substrate S is loaded and a reflecting mirror 42 provided on a side of the electron beam generating column 17 are measured by a laser interferometer 43. The pressure relationship in this arrangement is P0<PB>P6-3>P6-2>P6-1>P1, wherein PB represents an internal pressure of the static bearing 35, and P6-3, P6-2 and P6-1 represent the pressures in the vacuum grooves 26 of the non-contacting seal device 25 which are evacuated through the evacuation lines. If P0, PB, P6-3, P6-2, P6-1 and P1 are replaced by the corresponding degrees of vacuum DV0, DVB, DB6-3, DB6-2, DV6-1 and DV1, the relationship DV1>DV6-1>DV6-2>DV6-3>DVB<DV0 is established. DVB represents the degree of vacuum of the static bearing 35.

In the arrangement of FIG. 7, only one vacuum chamber 1 is provided. Therefore, a vacuum system having a simple construction can be used, and the size of the apparatus can be reduced. However, as in the case of FIG. 5, when the non-contacting seal device 25 stops operating, atmospheric pressure is inevitably introduced into the first vacuum chamber 1 through the passage 4 and therefore, the pressure in the first vacuum chamber 1 becomes substantially equal to atmospheric pressure. That is, the vacuum of the first vacuum chamber 1 cannot be maintained. Consequently, a considerable amount of time is required for reproducing a vacuum.

In a substrate processing apparatus shown in FIG. 8, differing from the apparatus of FIG. 7, a space in which the drive device 15 (such as a linear motor) is provided is defined, by the cover 8, as the second space or chamber 7 which is separated from an ambient atmosphere by the cover 8 and from the first vacuum chamber 1 by the wall 6 and the non-contacting seal device 25. In this apparatus, the pressure relationship is P7<PB>P6-3>P6-2>P6-1>P1. If P7, PB, P6-3, P6-2, P5-1 and P1 are replaced by the corresponding degrees of vacuum DV7, DVB, DV6-3, DV6-2, DV6-1 and DV1, the relationship DV1>DV6-1>DV6-2>DV6-3>DVB<DV7 is established.

The drive device 15 is not limited to a linear motor. For example, a cylinder device may be used. When a cylinder device is used as the drive device 15, care must be taken to avoid 1) leakage of a differential fluid from a seal portion (a release of gas), 2) generation of dust in the seal portion and 3) a temperature change caused by compression and expansion of a fluid.

In a conventional technique shown in FIG. 2, a device (such as a drive device) which causes a release of gas, and generation of dust and heat, is provided in the second space or vacuum chamber 2a, while a substrate is provided in the first space or vacuum chamber 1a. A pressure differential between the first vacuum chamber 1a and the second vacuum chamber 2a is determined so as to satisfy the relationship P1<P2 (In terms of a degree of vacuum DV, DV1>DV2). With respect to the reason for this determination, it is considered as follows. With respect to the first vacuum chamber 1a, a high degree of vacuum is required to be produced, because a clean environment must be formed in a space in which a substrate is provided. With respect to the second vacuum chamber 2a in which a device that causes a deterioration in the second vacuum chamber 2a is provided, a release of gas from the device cannot be avoided, and cleanliness of the second vacuum chamber 2 is not as highly necessary as compared to the first vacuum chamber 1a. Therefore, the vacuum of the second vacuum chamber 2a may be lower than that of the first vacuum chamber 1a.

However, leakage of gas inevitably occurs between two chambers having different pressures. That is, there is a possibility that part of a gas generated in the second vacuum chamber 2a flows into the first vacuum chamber 1a, which is required to be clean.

Further, in practice, there is a problem of a reverse flow or diffusion of gas derived from an oil component from an oil-sealed rotary vacuum pump, an oil component remaining in parts or ducts of a vacuum system, and a lubricant used for the vacuum pump. When the above pressure relationship P1<P2 (in terms of a degree of vacuum DV, DV2<DV1) is established in the apparatus of FIG. 2, a gas which has been introduced into the second vacuum chamber 2a due to the above-mentioned reverse flow or diffusion is further introduced from the second vacuum chamber 2a into the first vacuum chamber 1a.

In a conventional technique shown in FIG. 6, the non-contacting seal device (differential exhausting seal device) 25 is employed as a seal device. When a gap between the connecting member 16 and the inner circumferential surface of the wall 6 defining the passage 3a is indicated by g0, the value of g0 is about 5 to 50 μm. From the viewpoint of reducing a load on the vacuum system, the value of g0 should be minimized. This means that a sealing performance changes due to variations in the value of g0 resulting from pressure variations (in a range between atmospheric pressure and a vacuum pressure) in the vacuum chamber. To prevent such variations in the value of g0, it is necessary to form a rigid structure by, for example, increasing a wall-thickness of the housing 3 defining the vacuum chamber. However, this leads to a problem, such as a large weight of the apparatus.

The same problem is encountered in the apparatus shown in FIG. 8. Further, in the apparatus of FIG. 8 in which the non-contacting type guide element 35 is used, a guiding performance also changes due to variations in the value of gap g0. Therefore, a problem occurs, such that orthogonality of the movable base 33 of the stage device 31 is impaired, or the substrate's surface is vertically displaced.

FIG. 9 indicates the pressure relationship established in the apparatus in which the differential exhausting seal device 25 (of a type having three vacuum grooves) is provided between the first vacuum chamber 1a and the second chamber or space 7. P7 may be atmospheric pressure. The gas flowing towards the first vacuum chamber 1a (in which a substrate is processed) due to a pressure differential between the first vacuum chamber 1a and the second chamber or space 7 is sucked through the three vacuum grooves, thus preventing the gas from flowing into the first vacuum chamber 1a. Normally, the pressure distribution (relationship) is P7>P6-3>P6-2>P6-1>P1. Therefore, a slight amount of gas flows from a region under pressure P5 into the first vacuum chamber 1a under pressure P1. It is most undesirable to allow a reverse flow or diffusion of gas derived from an oil component from an oil-sealed rotary vacuum pump, an oil component remaining in parts or ducts of a vacuum system, and a lubricant used for the vacuum pump. In many cases, a high-vacuum pump having a large volume is used so that the first vacuum chamber 1a has the highest degree of vacuum (P1 becomes the lowest pressure). However, this high-vacuum pump causes a reverse flow of an oil component from the oil-sealed rotary vacuum pump for the vacuum groove of the pressure P6-1, an oil component remaining in parts or ducts of the vacuum system, and a vapor of a lubricant used for the vacuum pump.

SUMMARY OF THE INVENTION

It is an object of the present invention to provide a seal device, which avoids the risk of contamination of a space required to have high cleanliness and deposition of water on an inner wall surface of the space, and which is capable of reducing a time required for reproducing a vacuum. It is another object of the present invention to provide a method for operating the seal device.

It is a further object of the present invention to provide a substrate processing apparatus comprising a first vacuum chamber in which a substrate loaded on a stage device is processed and a second vacuum chamber in which a drive device for driving the stage device is provided, wherein the pressure in the second vacuum chamber is controlled to be lower than that in the first vacuum chamber, to thereby solve the above-mentioned problems.

It is a further object of the present invention to provide a substrate processing apparatus comprising a first chamber in which a substrate loaded on a stage device is processed and a second chamber in which a drive device for driving the stage device is provided, wherein the first chamber is maintained in a vacuum and a non-contacting seal device is provided between the first chamber and the second chamber, and respective pressures in the first and second chambers are controlled in relation to an operating condition of the non-contacting seal device, to thereby solve the above-mentioned problems.

It is a still further object of the present invention to provide a substrate processing apparatus comprising a first chamber in which a substrate loaded on a stage device is processed and a second chamber in which a drive device for driving the stage device is provided, wherein the first chamber is maintained in a vacuum, and a differential vacuum seal device comprising a plurality of vacuum grooves is provided between the first chamber and the second chamber, to enable the pressures in the vacuum grooves to be appropriately controlled, thereby solving the above-described problems.

The present invention provides a seal device comprising a sealing passage which allows communication between a first space and a second space, and evacuation lines individually connected to the first space and the sealing passage, wherein a gas feed line for feeding dry gas is connected to the sealing passage.

In the above-mentioned seal device, a gas feed line for feeding dry gas may be connected to the sealing passage, and the timing of starting/stopping the feeding of dry gas through the gas feed line and the timing of starting/stopping evacuation through the evacuation lines connected to the first space and the sealing passage may be controlled. By this arrangement, it is possible to prevent a considerable amount of gas from flowing from the second space having a low degree of cleanliness to the first space having a high degree of cleanliness. It is also possible to suppress deposition of water on an inner wall surface of the first space, which is required to have high cleanliness, thus reducing the time required for regenerating a vacuum.

In the above-mentioned seal device, the degree of cleanliness or vacuum of the first space and the degree of cleanliness or vacuum of the second space may be different so that the first space has a high degree of cleanliness or vacuum and the second space has a low degree of cleanliness or vacuum, and the gas feed line may be connected to the sealing passage at a position between the second space and the evacuation line located closest to the second space.

As described above, in the present invention, the gas feed line may be connected to the sealing passage at a position between the second space and the evacuation line located closest to the second space. With this arrangement, a flow of gas from the second space having low cleanliness or vacuum to the first space having high cleanliness or vacuume can be effectively suppressed.

The present invention provides a method for operating the above-mentioned seal device, wherein the seal device is started using the following sequence of steps (1) to (4):

(1) feeding dry gas through the gas feed line;
(2) controlling a flow rate of the dry gas fed through the gas feed line so that a pressure at a gas feed port of the gas feed line formed in the sealing passage is maintained at a level equal to or higher than a pressure in the second space;
(3) starting evacuation through the evacuation line for the sealing passage; and
(4) starting evacuation through the evacuation line for the first space.

In the above-mentioned method, the seal device is started using the above sequence of steps (1) to (4), to thereby prevent a considerable amount of gas from flowing from the second space into the first space. Therefore, it is possible to prevent a lowering of cleanliness of the first space, which would otherwise result from a flow of gas from the second space having low cleanliness into the first space having high cleanliness.

Further, it is possible to avoid a situation that due to a high humidity of the gas flowing into the first space, water is deposited on an inner wall surface of the first space thereby lowering the ultimate degree of vacuum. Further, it is possible to prevent clogging of the sealing passage which would otherwise result from entry of foreign matter contained in the second space into a small gap in the sealing passage.

The present invention also provides a method for operating the above-mentioned seal device, wherein the seal device is stopped using the following sequence of steps (1) to (4):

(1) feeding dry gas through the gas feed line;
(2) controlling a flow rate of the dry gas fed through the gas feed line so that a pressure at a gas feed port of the gas feed line formed in the sealing passage is maintained at a level equal to or higher than a pressure in the second space;
(3) stopping evacuation through the evacuation line for the first space; and
(4) stopping evacuation through the evacuation line for the sealing passage.

In the above-mentioned method, the seal device is stopped using the above sequence of steps (1) to (4), to thereby prevent a considerable amount of gas from flowing from the second space into the first space. Therefore, it is possible to prevent a lowering of cleanliness of the first space, which would otherwise result from a flow of gas from the second space having low cleanliness into the first space having high cleanliness. Further, it is possible to avoid a situation where water is deposited on an inner wall surface of the first space due to a high humidity of the gas flowing into the first space. Therefore, a time required for reproducing a vacuum can be made relatively short. Further, it is possible to prevent the sealing passage from becoming clogged due to entry of foreign matter contained in the second space into a small gap in the sealing passage.

The present invention further provides a method for operating the above-mentioned seal device, wherein after stopping the seal device, dry gas is fed through the gas feed line and a flow rate of the dry gas fed through the gas feed line is controlled so that a pressure at a gas feed port of the gas feed line formed in the sealing passage is maintained at a level equal to or higher than a pressure in the second space.

In the above-mentioned method, after stopping of the seal device, dry gas is fed through the gas feed line and a flow rate of the dry gas fed through the gas feed line is controlled so that a pressure at a gas feed port of the gas feed line formed in the sealing passage is maintained at a level equal to or higher than a pressure in the second space. By using this arrangement, it is possible to prevent a lowering of cleanliness of the first space due to a flow of gas from the second space having low cleanliness into the first space having high cleanliness. Further, it is possible to avoid deposition of water on an inner wall surface of the first space due to a high humidity of the gas flowing into the first space. Therefore, the time required for regenerating a vacuum can be made relatively short.

In the above-mentioned method for operating the seal device, the dry gas fed through the gas feed line may be a gas comprising substantially the same components as air and having a humidity of 5% or less.

As described above, in the present invention, the dry gas fed through the gas feed line may comprise substantially the same components as air and have a humidity of 5% or less. With this arrangement, the amount of deposition of water on an inner wall surface of the first space is reduced. Further, workers can enter the second space without any difficulties.

The present invention further provides a substrate processing apparatus comprising a first vacuum chamber in which a stage device is provided and a substrate loaded on the stage device is processed, and a second vacuum chamber provided separately from the first vacuum chamber; a drive element for driving the stage device is provided in the second vacuum chamber; with a pressure P1 in the first vacuum chamber and a pressure P2 in the second vacuum chamber being controlled so as to maintain a relationship $P1 \geq P2$.

In the above-mentioned substrate processing apparatus, although a flow of gas from the first vacuum chamber into the second vacuum chamber occurs, gas generated in or released into the second vacuum chamber is prevented from flowing into the first vacuum chamber in which a substrate is processed. In this way, it is possible to prevent contamination of substrates, reflecting mirrors or marks.

The present invention further provides a substrate processing apparatus comprising a first chamber in which a stage device is provided, and in which a substrate loaded on the stage device is processed; with a second chamber being provided separately from the first chamber. A drive element for driving the stage device is provided in the second chamber, and the first chamber is maintained in a vacuum, with a non-contacting seal device being provided between the first chamber and the second chamber. The second chamber is capable of being selectively connected to a supply source of dry gas; and a pressure in the second chamber is controlled to be equal to or approximate to atmospheric pressure by supplying and discharging the dry gas.

In the above mentioned substrate processing apparatus according to the second embodiment of the present invention, even when the non-contacting seal device stops operating, there is no gas flow from an external environment, such as a clean room, into the vacuum chamber. Thus, the substrate processing apparatus is able to adapt in a case that an emergency stop of the seal device occurs, and the time for regenerating a vacuum in the vacuum chamber can thus be reduced. Further, there is no need to increase a wall-thickness of a cover or a housing for a chamber so as to maintain a predetermined small gap in the non-contacting seal portion. Consequently, the apparatus can be reduced in size, and made lightweight in construction.

The present invention further provides a substrate processing apparatus comprising a first chamber in which a stage device is provided and a substrate loaded on the stage device is processed, with a second chamber being provided separately from the first chamber. A drive element for driving the stage device is provided in the second chamber, and the first chamber is maintained in a vacuum, and a non-contacting seal device is provided between the first chamber and the second chamber. The second chamber is capable of being selectively connected to a supply source of dry gas. When the non-contacting seal device is operated while the stage device is being driven, a pressure in the second chamber is controlled to be equal to or approximate to atmospheric pressure by supplying and discharging the dry gas. During a period that the non-contacting seal device is not operated, the second chamber is disconnected from the supply source of dry gas, and discharge of the gas from the second chamber is stopped.

In the above above-mentioned substrate processing apparatus, it is possible to prevent a reverse flow or diffusion of gas from a vacuum system of the differential vacuum seal device, which would otherwise result in contamination of the first vacuum chamber. Consequently, cleanliness of the first vacuum chamber can be maintained at a satisfactory level, and the apparatus does not need frequent cleaning or maintenance.

The present invention further provides a substrate processing apparatus comprising a first chamber in which a stage device is provided and a substrate loaded on the stage device is processed, and a second chamber provided separately from the first chamber. A drive element for driving the stage device is provided in the second chamber. The first chamber is maintained in a vacuum and a differential vacuum seal device comprising a plurality of vacuum grooves is provided between the first chamber and the second chamber, with a vacuum groove located closest to the first chamber having an internal pressure lower than or equal to a pressure in the first chamber.

DETAILED DESCRIPTION OF THE INVENTION

Hereinbelow, embodiments of the present invention are explained, with reference to FIGS. 10 to 15. As has been described, the problems arising at the time of starting the seal device are such that: (1) a gas occupying the second space 2, which has a lower degree of cleanliness than the first space 1, flows into the first space 1, resulting in a lowering of cleanliness of the first space 1; (2) due to a high humidity of the gas flowing from the second space 2, water is deposited on an inner surface of a wall defining the first space 1, thus lowering the ultimate degree of vacuum in the first space 1; and (3) foreign matter enters a narrow gap in the sealing passage 3, and clogs the sealing passage 3.

Figure 1:
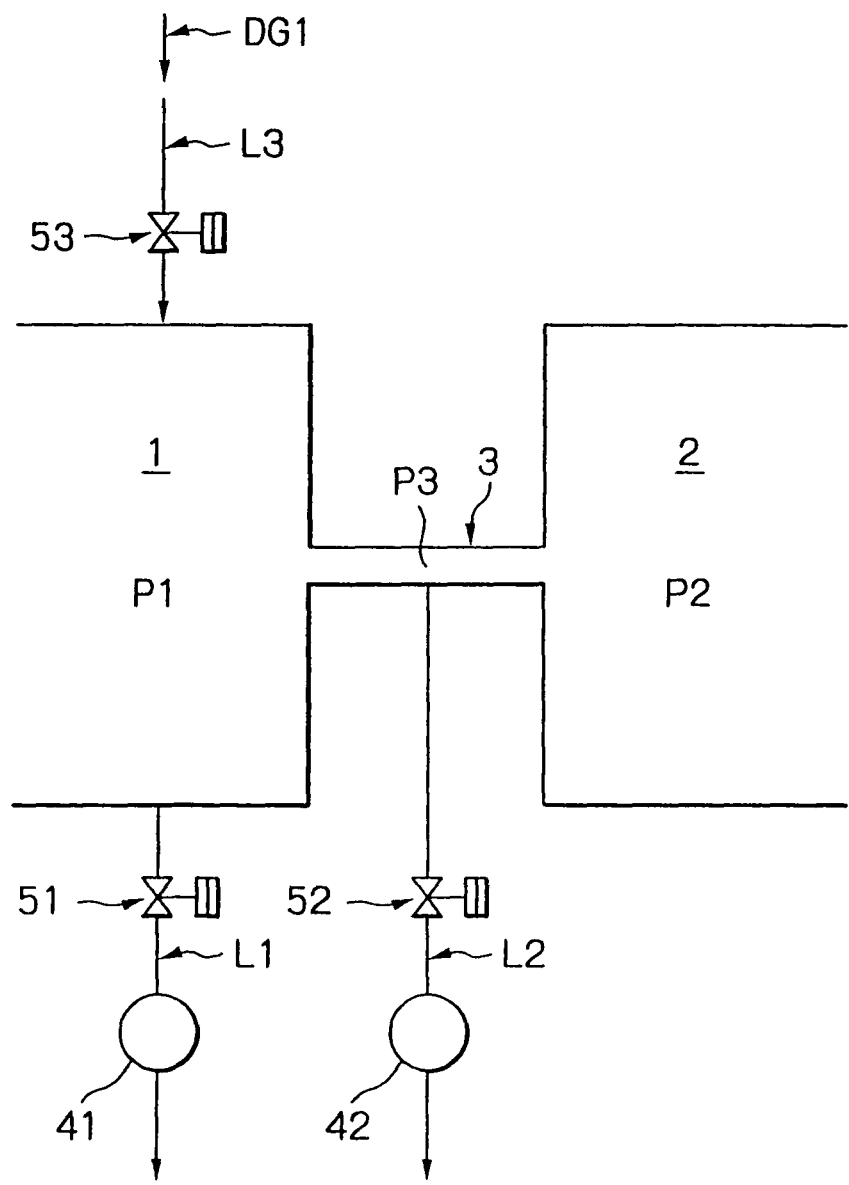
FIG. 1 is a diagram showing an example of a conventional seal device.
Figure 10:
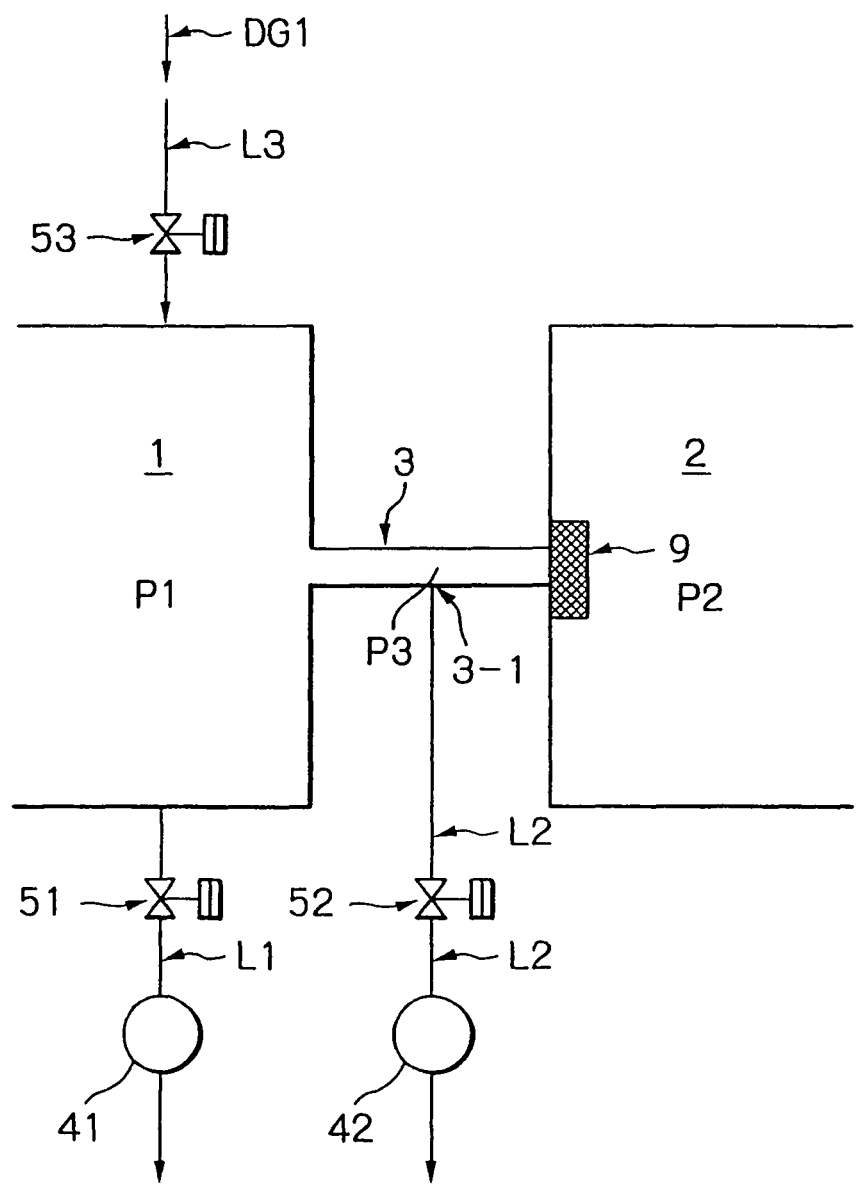
FIG. 10 is a diagram showing an example of a seal device of the present invention.

FIG. 10 is a diagram showing a principle of a seal device of the present invention. This seal device is the same as the seal device shown in FIG. 1, in that the sealing passage 3 is provided between the first space 1 and the second space 2, the evacuation line L1 provided with the valve 51 and the vacuum pump 41 is connected to the first space 1, the evacuation line L2 provided with the valve 52 and the vacuum pump 42 is connected to the evacuation line L2, and a gas feed line L3 provided with a valve 53 and a dry gas feed source (not shown) for feeding dry gas DG1 is connected to the first space 1. In this example, a filter 9 is provided at the sealing passage 3 on a side of the second space 2, so as to avoid the problem of entry of foreign matter contained in the second space 2, which is a common problem in CASES 1 and 2. By providing the filter 9, foreign matter is prevented from becoming mixed in a gas flowing from the second space 2 into the sealing passage 3.

The seal device is arranged by providing the sealing passage 3 between the first space 1 and the second space 2 and enabling the sealing passage 3 to perform a differential vacuum sealing function. This arrangement is employed because a non-contact type seal is required to be used for separating the first space 1 and the second space 2. The reason why use of a non-contact type seal is required is that a member connected to an object to be moved in the first space 1 extends in the sealing passage 3, and this member is moved in a longitudinal direction of the sealing passage 3 while a predetermined gap is maintained between the member and an inner wall surface defining the sealing passage 3. Therefore, the filter 9 in FIG. 2 cannot effectively prevent entry of foreign matter.

Figure 11:
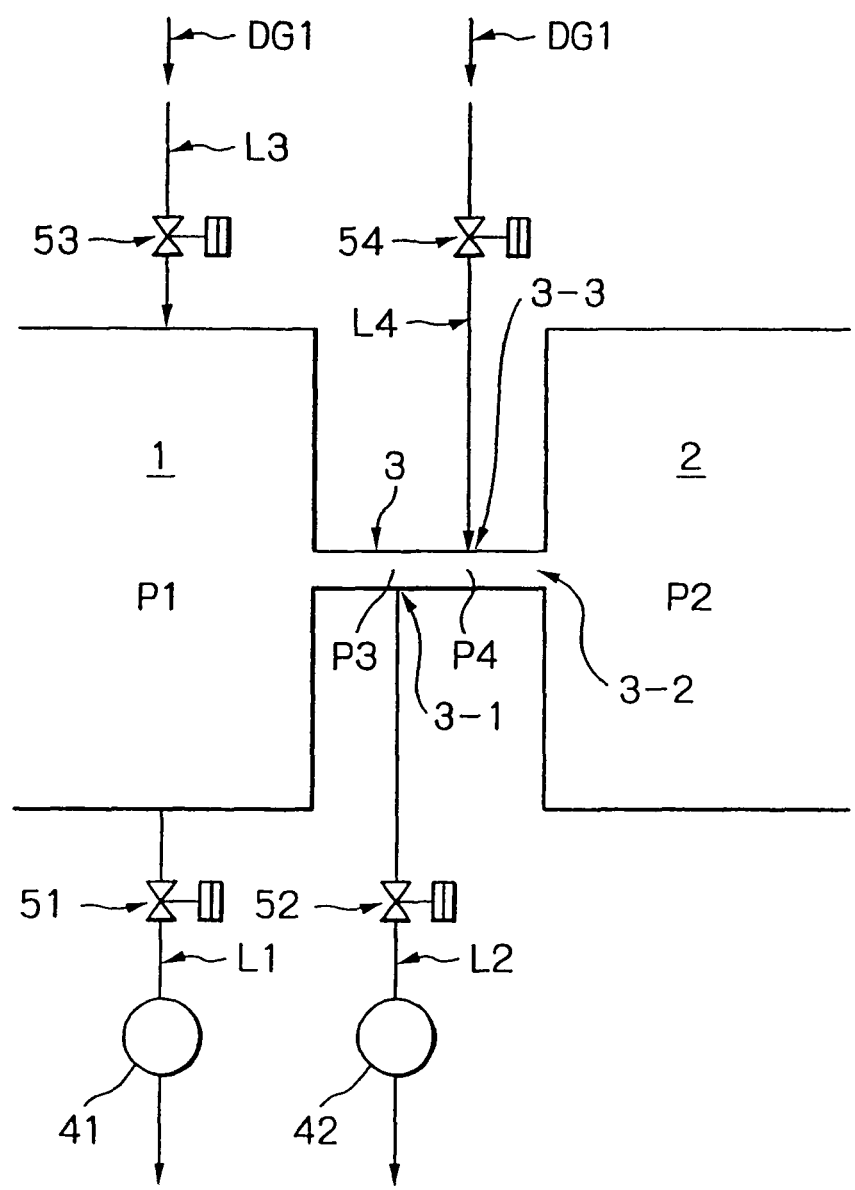
FIG. 11 is a diagram showing another example of a seal device of the present invention.

In the seal device of FIG. 11, another gas feed line L4 is provided. The gas feed line L4 is provided with a valve 54 and a dry gas feed source (not shown) for feeding dry gas DG2 and is connected to the sealing passage 3 between a vacuum port (or a vacuum groove) 3-1 for the evacuation line L2 and an open end 3-2 of the sealing passage 3 on a side of the second space 2.

In an initial state of this seal device, the pressure relationship P1=P3=P4=P2 is established (wherein P3 represents a pressure at the vacuum port 3-1 in the sealing passage 3, which port is connected to the evacuation line L2, and P4 represents a pressure at a gas feed port 3-3 in the sealing passage 3, which port is connected to the gas feed line L4). To avoid entry of foreign matter into the sealing passage 3, which occurs in CASES 1 and 2, the seal device is started using the following sequence of steps.

The valve 54 is opened, and the dry gas DG2 is fed through the gas feed line L4 to the sealing passage 3. As a result, the feed rate of the dry gas DG2 is controlled so that the pressure relationship P4=P2, preferably P4>P2, is maintained. Thereafter, the valve 52 and/or the valve 51 is opened, to thereby start evacuation. In this instance, the feed rate of the dry gas DG2 through the gas feed line L4 is controlled so that the pressure relationship P4=P2 or P4>P2 is maintained. Preferably, the valve 52 is first opened to thereby start evacuation through the evacuation line L2. In the above sequence of steps for starting the seal device, it is possible to prevent a considerable amount of gas from flowing from the second space 2 into the first space 1. Needless to say, feeding of the dry gas 14 through the gas feed line L4 may be stopped when the sealing passage 3 performs a sealing function in a normal operating condition.

Figure 3:
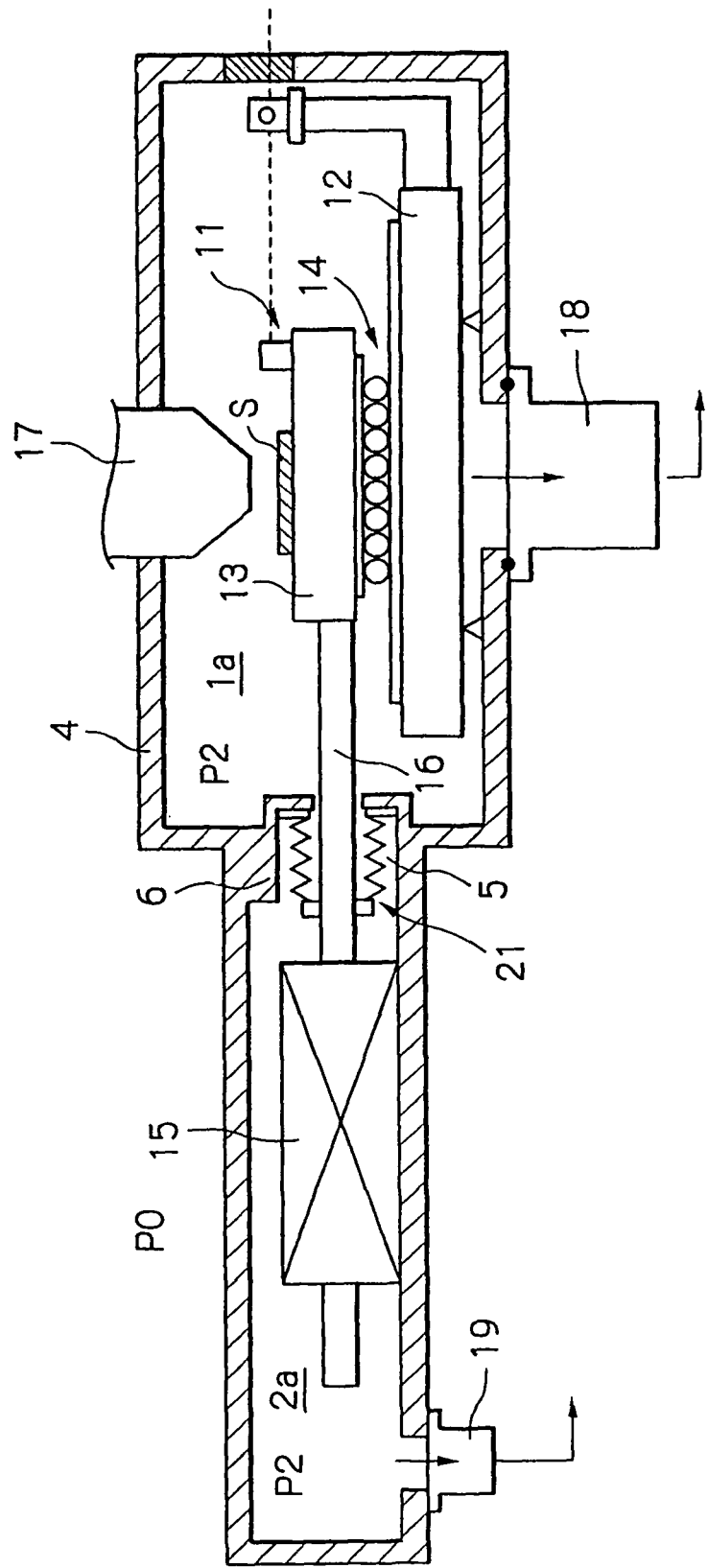
FIG. 3 is a schematic cross-sectional view of another example of a conventional substrate processing apparatus comprising two vacuum chambers.

In an apparatus wherein foreign matter in the second space 2 does not cause any problem when it is carried by the gas flow into the sealing passage 3, it is preferred to start the seal device in the same operating sequence as indicated in CASE 2. That is, it is preferred to start the seal device by first actuating the vacuum pump 42 and opening the valve 52, to thereby start evacuation through the evacuation line L2, and then actuating the vacuum pump 41 and opening the valve 51, to thereby start evacuation through the evacuation line L1. By using this operating sequence, it is possible to prevent a considerable amount of gas from flowing from the second space 2 into the first space 1, without using the gas feed line L4 shown in FIG. 3.

Figure 12:
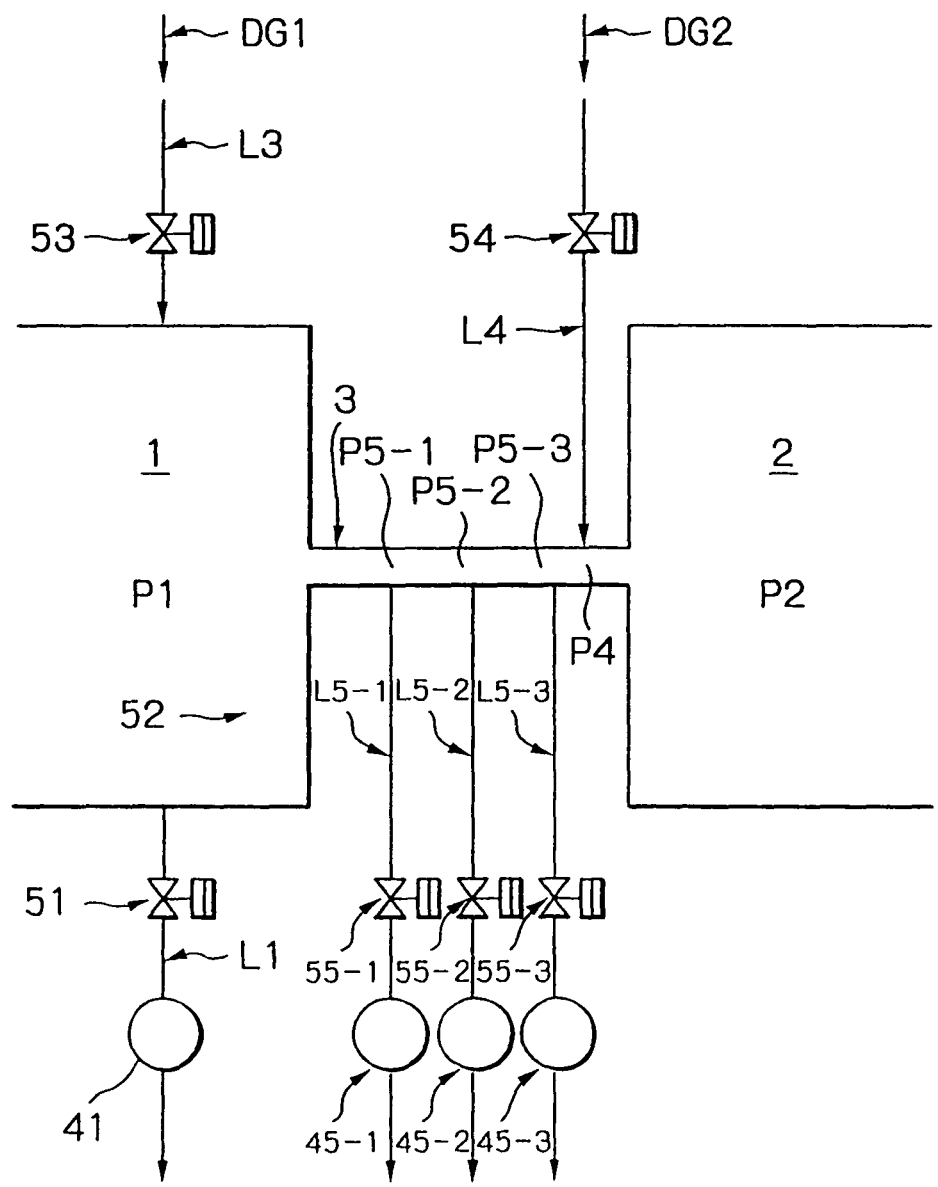
FIG. 12 is a diagram showing a further example of a seal device of the present invention.

Next, explanation is made with regard to how the present invention solves the problems arising at the time of stopping the seal device. The problems are caused by a considerable amount of gas flowing from the second space 2 into the first space 1. This can be avoided by the arrangements shown in FIGS. 10 and 11 in which a single evacuation line such as the evacuation line L2 is connected to the sealing passage 3. However, in practice, as shown in FIG. 12, it is advantageous to provide a plurality of (three in FIG. 14) evacuation lines L5-1, L5-2 and L5-3 connected to the sealing passage 3. The evacuation lines L5-1, L5-2 and L5-3 are provided with vacuum pumps 45-1, 45-2 and 45-3 and valves 55-1, 55-2 and 55-3, respectively.

The seal device in FIG. 12 is arranged so as to provide different degrees of vacuum in vacuum ports of the respective evacuation lines L5-1, L5-2 and L5-3, thereby creating three stages of vacuum increasing towards the first space 1. This enables a high vacuum to be easily generated in the first space 1. Therefore, it is preferred that the gas feed line L4 be connected to the sealing passage 3 at a position between the second space 2 and the evacuation line L5-3 located closest to the second space 2.

Figure 4:
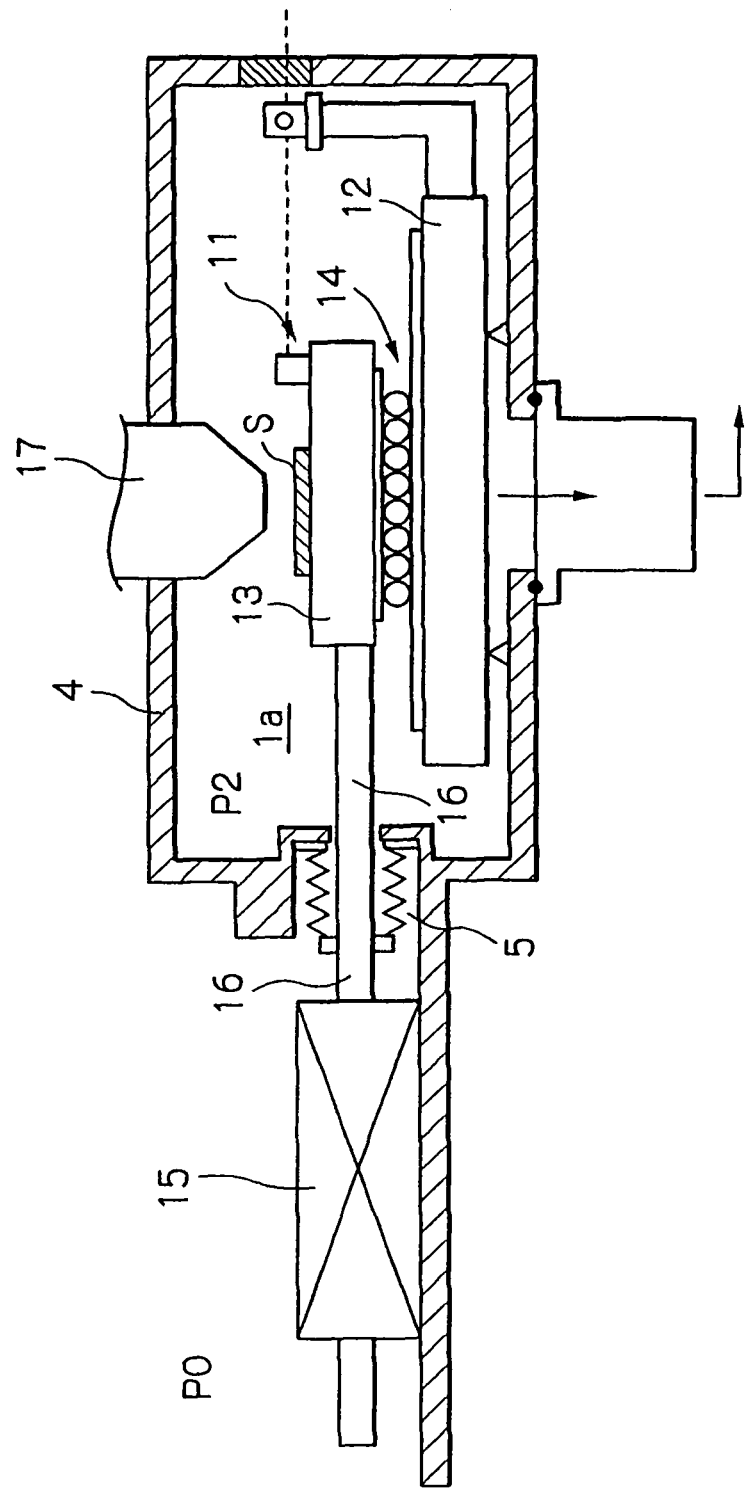
FIG. 4 is a schematic cross-sectional view of an example of a conventional substrate processing apparatus comprising one vacuum chamber.
Figure 5:
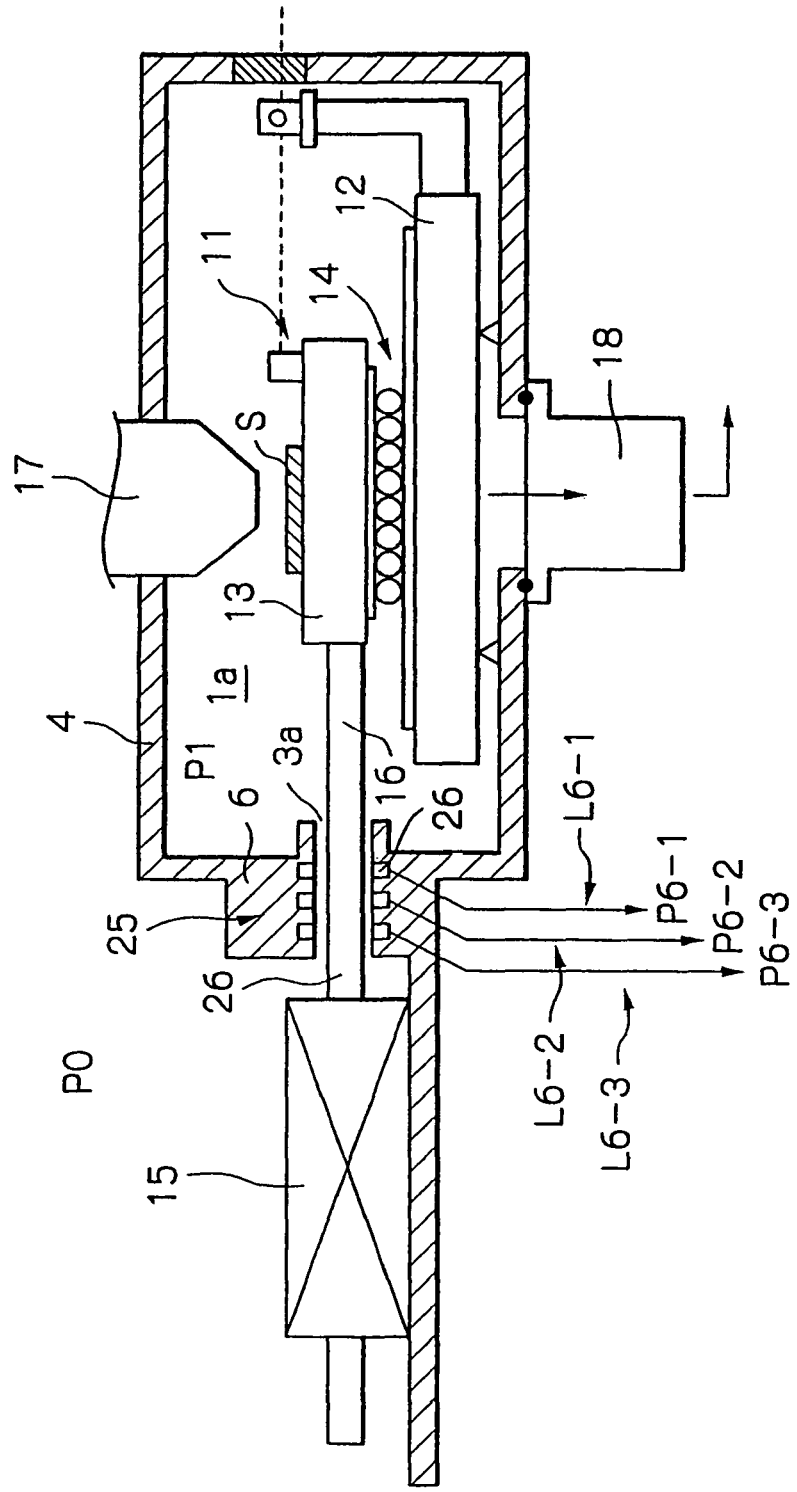
FIG. 5 is a schematic cross-sectional view of another example of a conventional substrate processing apparatus comprising one vacuum chamber.

To avoid a situation where a considerable amount of gas flows from the second space 2 into the first space 1, the seal device shown in FIG. 4 is stopped using the following sequence of steps. The pressure relationship in a normal operating condition of the seal device is P1<P5-1<P5-2<P5-3<P2, wherein P5-1, P5-2 and P5-3, respectively, represent pressures in respective vacuum ports for the evacuation lines L5-1, L5-2 and L5-3. For example, P1 is 1E-6 Torr, P5-1 is 1E-3 Torr, P5-2 is 1E-1 Torr and P5-3 is several ten Torr and P2 is atmospheric pressure.

In a first step, the valve 54 is opened, to thereby feed the dry gas DG2 through the gas feed line L4 to the sealing passage 3. When the seal device is arranged such that feeding of dry gas DG2 through the gas feed line L4 is constantly conducted, it is confirmed whether feeding of the dry gas DG2 is satisfactorily conducted. In a second step, the feed rate of the dry gas DG2 through the gas feed line L4 is controlled so that the relationship P4=P2, preferably P4>P2, is maintained even when the pressures P-1, P5-1, P5-2 and P5-3 vary. The control of the feed rate of the dry gas DG2 is conducted by using a controller (not shown) capable of detecting pressure.

Next, explanation is made with regard to CASE 3 (the valves 51 and 52 are closed at the same time), CASE 4 (the valve 52 is first closed, and then the valve 61 is closed) and CASE 5 (the valve 51 is first closed, and then the valve 52 is closed). The seal device of FIG. 12 can be stopped by using gradual pressure variations effected by halting evacuation through the evacuation lines L5-1, L5-2 and L5-3 at different timings.

In FIG. 12, the seal device may be stopped without using the gas feed line L4. In this case, (1) the valve 51 is closed to thereby stop evacuation through the evacuation line L1, and the valve 53 is opened, to thereby feed the dry gas DG1 through the gas feed line L3 into the first space 1. Preferably, while regulating the flow rate of a gas discharged through the evacuation line L1 by means of the valve 51, the feed rate of the dry gas DG1 through the gas feed line L3 is gradually increased by means of the valve 53. (2) When the pressure relationship P1=P5-1 is established, the valve 13-1 is closed, to thereby stop evacuation through the evacuation line L5-1. (3) Subsequently, when the pressure relationship P1=P5-1=P5-2 is established, the valve 13-2 is closed, to thereby stop evacuation through the evacuation line L5-2. (4) Further, when the pressure relationship P1=P5-1=P5-2=P5-3 is obtained, the valve 13-3 is closed, to thereby stop evacuation through the evacuation line L5-3. Thus, evacuation through all the evacuation lines is stopped. (5) When the pressure relationship P1=P5-1=P5-2=P5-3=P2=atmospheric pressure is established, the valve 53 is closed, to thereby stop the feeding of the dry gas DG1 through the gas feed line L3.

However, it is preferred to use the gas feed line L4 provided with the valve 54. In this case, as described above, the valve 54 is controlled so as to control the feed rate of dry gas through the gas feed line L4 so that a pressure relationship P4=P2, preferably P4>P2, is obtained. Thereafter, the above-mentioned steps (1) to (5) are conducted. Finally, the valve 54 is closed, to thereby stop the feeding of the dry gas DG2 through the gas feed line L4.

Next, description is made with regard to how the problem which arises after stopping the seal device is solved by the present invention. CASES 6 and 7 involve a problem caused by deposition of a water component of a gas from the second space 2 on an inner wall surface of the first space 1. When a water component is deposited on an inner wall surface of the first space 1, the ultimate degree of vacuum in the first space 1 is markedly reduced, thus increasing a time required for restarting the entire apparatus.

To solve this problem, preferably, as shown in FIG. 12, the gas feed line L4 provided with the valve 54 is provided. After stopping of the seal device, a slight amount of dry gas is continuously flowed through the gas feed line L4 by control of the valve 54 so that the pressure P4 is maintained at a level slightly higher than the pressure P2. When the second space 2 is communicated with a space which workers enter, the dry gas DG2 is preferably dry air (air having a humidity of 5% or less).

In a case that the gas feed line L4 provided with the valve 54 is not provided, the dry gas DG1 is fed through the gas feed line L3 provided with the valve 53, while the flow rate of the dry gas DG1 is controlled such that the pressure P1 in the first space 1 becomes slightly higher than the pressure P2 in the second space 2.

Figure 2:
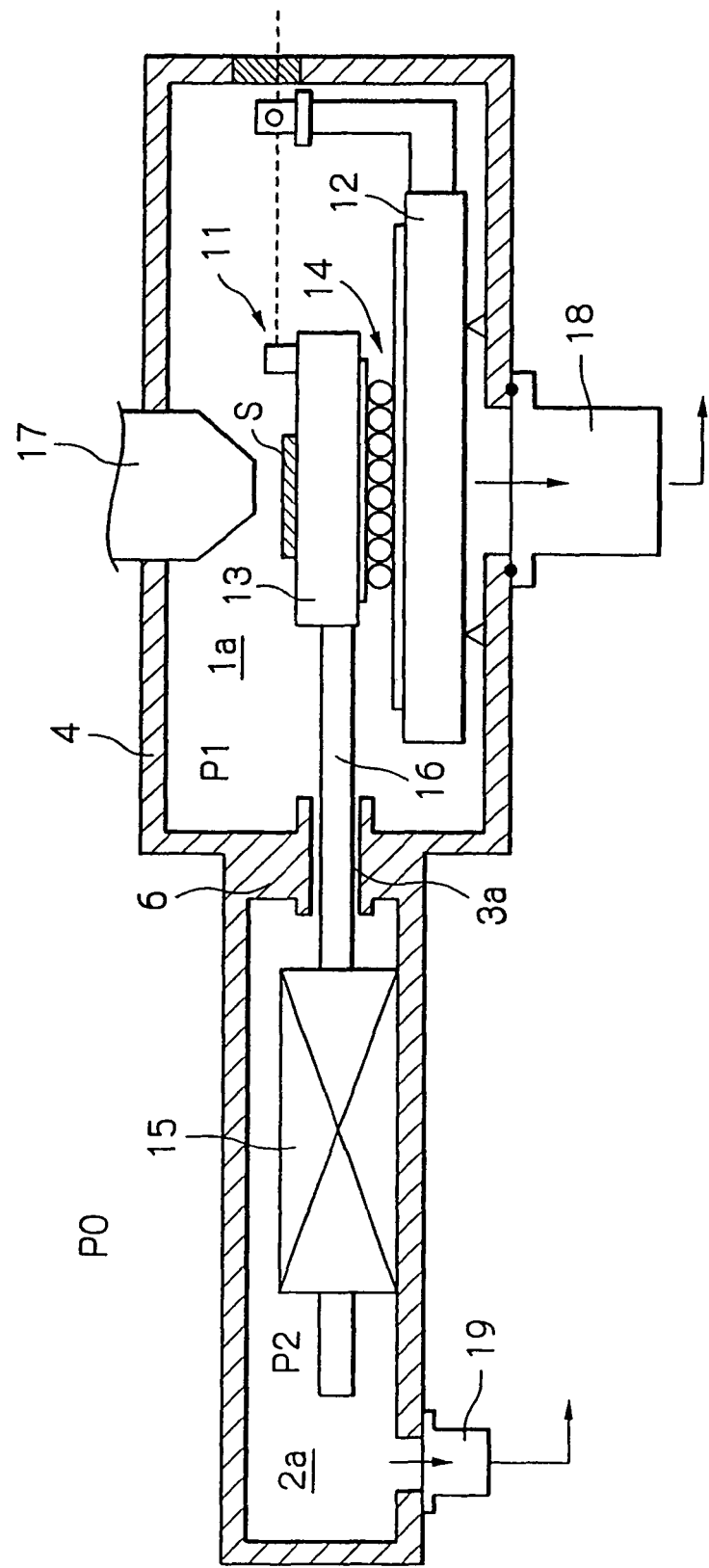
FIG. 2 is a schematic cross-sectional view of an example of a conventional substrate processing apparatus comprising two vacuum chambers.

The substrate processing apparatus according to this embodiment is substantially the same as that of FIG. 2, except that the pressure P1 in the first space or vacuum chamber 1a and the pressure P2 in the second space or vacuum chamber 2a are controlled so as to satisfy the relationship P1≥P2. By this arrangement, although a gas flows from the first vacuum chamber 1a into the second vacuum chamber 2a, a gas generated in or released into the second vacuum chamber 2a does not flow into the first vacuum chamber 1a in which a substrate is processed. Therefore, it is possible to prevent contamination of substrates, reflecting mirrors, and marks (not shown).

Figure 6:
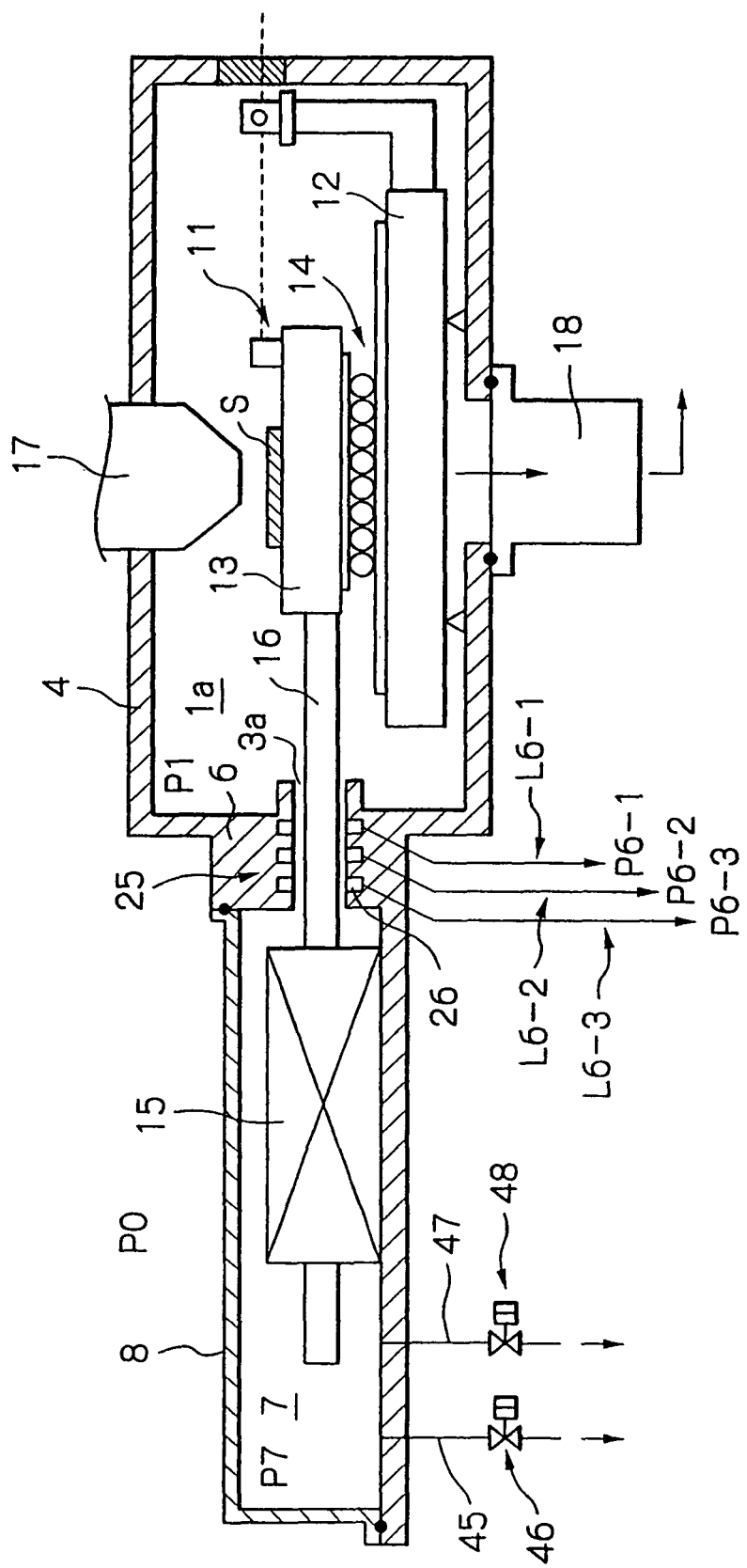
FIG. 6 is a schematic cross-sectional view of a conventional substrate processing apparatus comprising a vacuum chamber for processing a substrate, and a chamber provided separately from the vacuum chamber.
Figure 7:
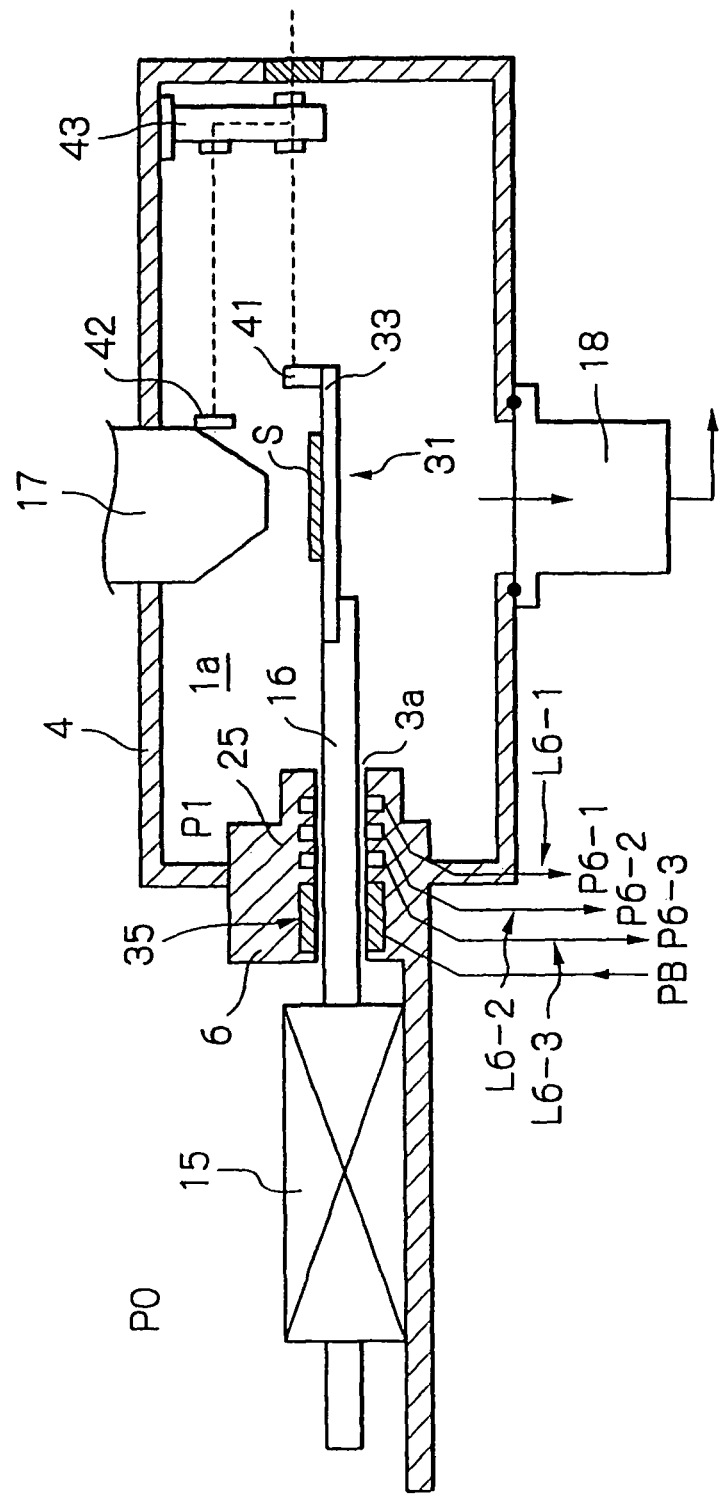
FIG. 7 is a schematic cross-sectional view of an example of a substrate processing apparatus in which a stage device having no rolling type support mechanism is provided.
Figure 13:
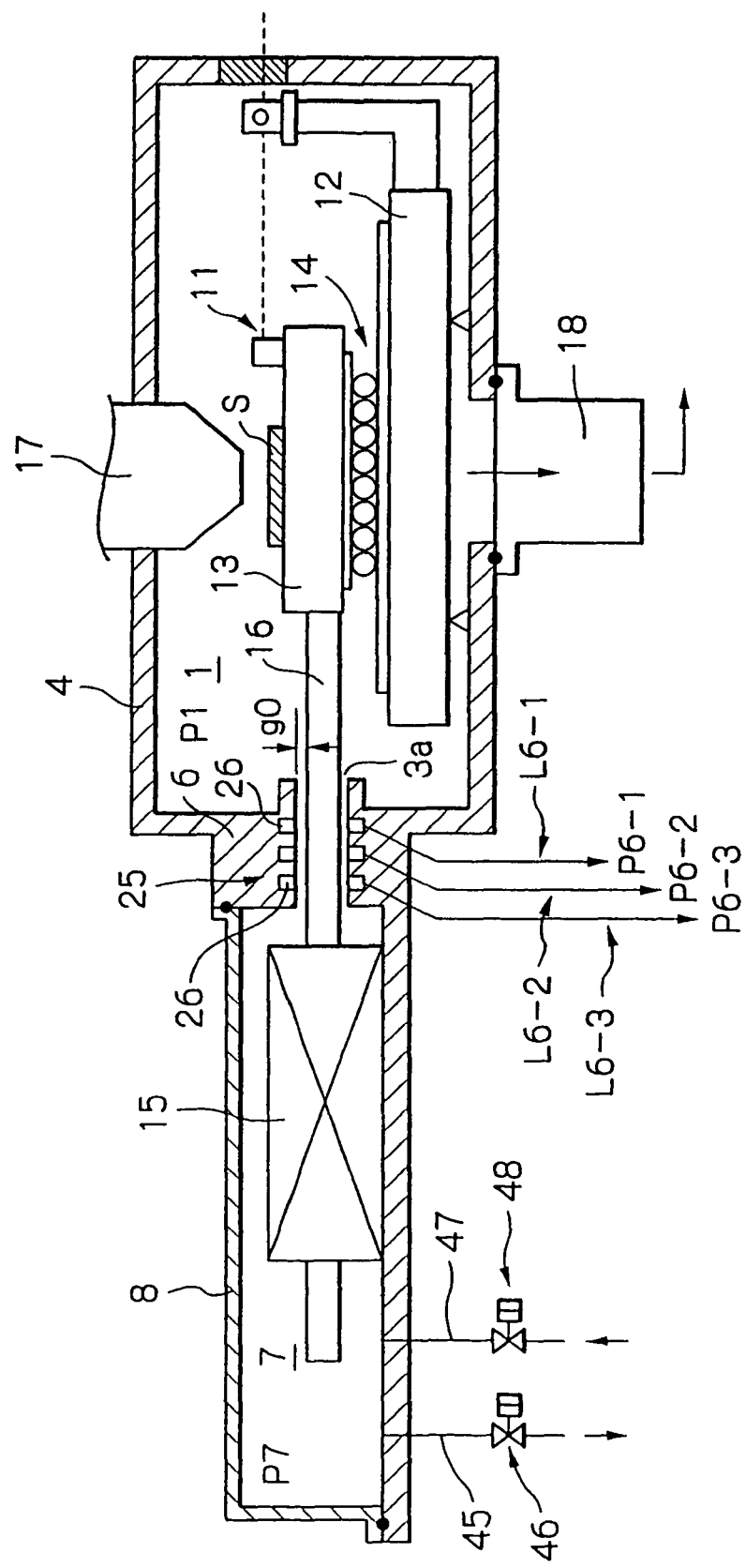
FIG. 13 is a schematic cross-sectional view of a substrate processing apparatus comprising a vacuum chamber according to an embodiment of the present invention.

The substrate processing apparatus in this embodiment is shown in FIG. 13. The parts or components of the substrate processing apparatus of FIG. 13 are substantially the same as those shown in FIG. 6 and are therefore designated by the same reference numerals as used in FIG. 6. In FIG. 13, reference numeral 1a denotes a first space or vacuum chamber;

7 a second space or chamber separated from an ambient atmosphere by the cover 8; 4 a housing defining the first vacuum chamber 1a; 3a a passage formed by the wall 6 between the first vacuum chamber 1a and the second chamber 7; 11 a stage device provided in the first vacuum chamber 1a and comprising the stationary base 12 and the movable base 13 movably supported on the stationary base 12 by the rolling mechanism 14; 15 a drive device provided in the second space or vacuum chamber 2a and connected to the movable base 13 through the connecting member 16 extending through the passage 3a; and 17 an electron beam generating column for processing a substrate S loaded on the movable base 13. The first vacuum chamber 1 is evacuated by means of the vacuum pump 18, such as an ion pump. The second chamber 7 is connected to an evacuation line 45 which is controllably opened and closed by a control valve 46, and a dry gas feed line 47 which is controllably opened and closed by a control valve 48. In the passage 3a in which the connecting member 16 connecting the stage device 11 and the drive device 15 extends, there is provided a non-contacting seal device (differential vacuum seal device) 25 having the same structure and performing the same function as the non-contacting seal device 25 in FIG. 6. The non-contacting seal device 25 includes a plurality of (three in this embodiment) vacuum grooves 26 formed in the inner circumferential surface of the wall 6 in the passage 4, which are individually connected to evacuation lines for performing evacuation at individual vacuum pressures P6-3, P6-2 and P6-1.

Figure 8:
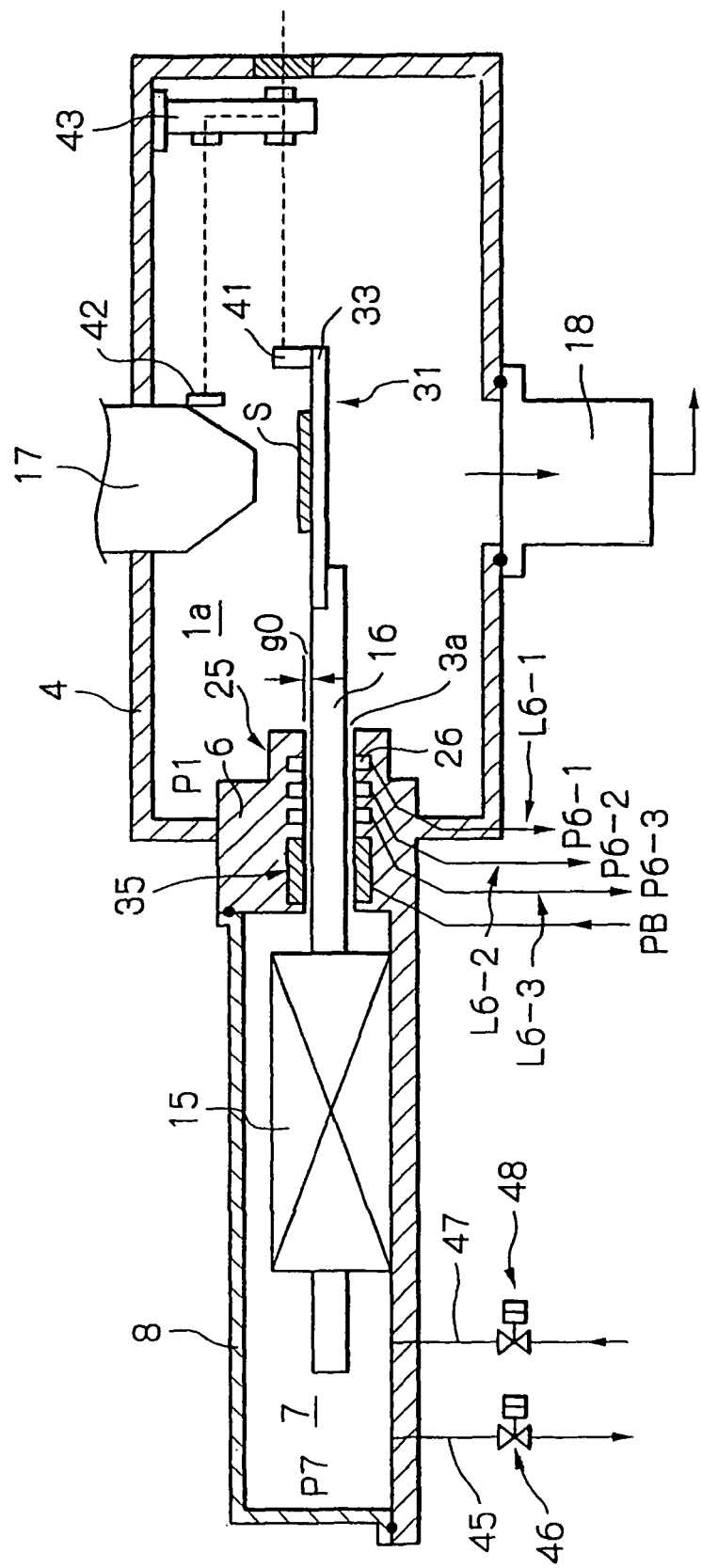
FIG. 8 is a schematic cross-sectional view of another example of a substrate processing apparatus in which a stage device having no rolling type support mechanism is provided.
Figure 9:
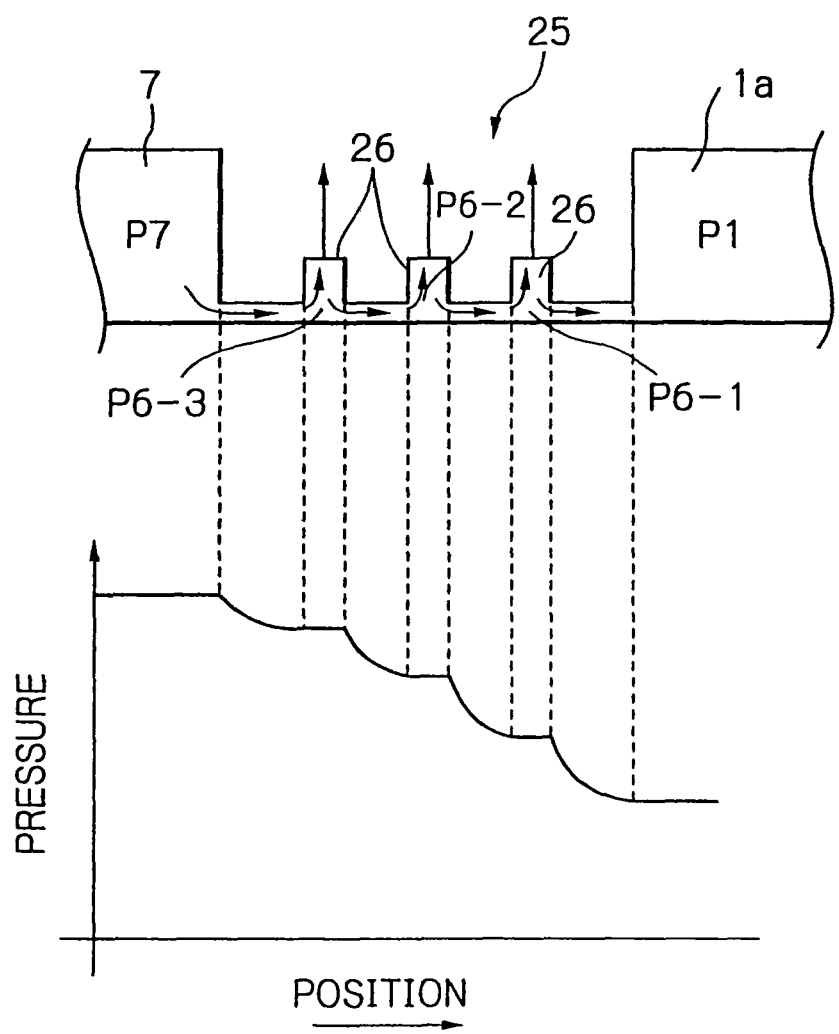
FIG. 9 is a graph indicating the pressure relationship with respect to two vacuum chambers and vacuum grooves of a differential vacuum seal device provided therebetween.
Figure 14:
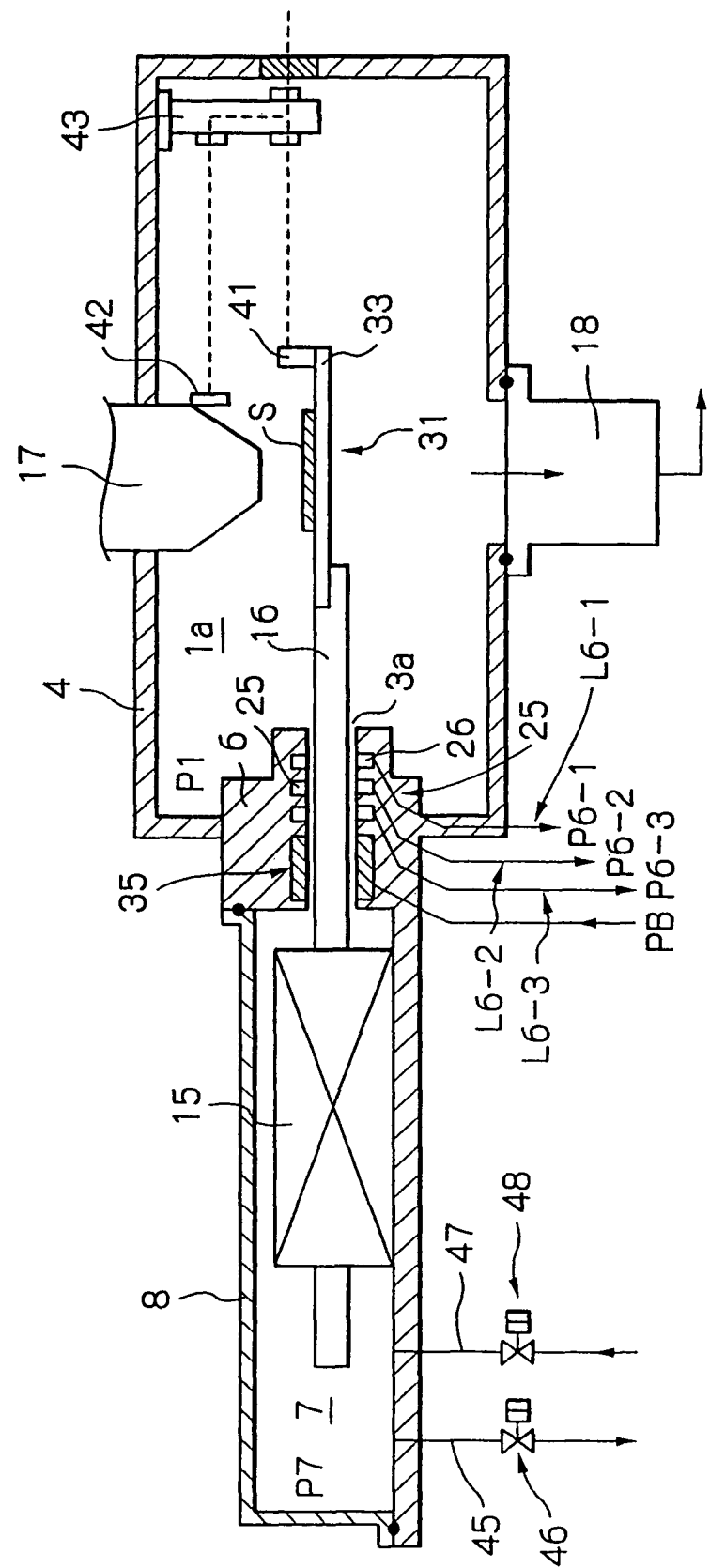
FIG. 14 is a schematic cross-sectional view of a substrate processing apparatus comprising a vacuum chamber according to another embodiment of the present invention.
Figure 15:
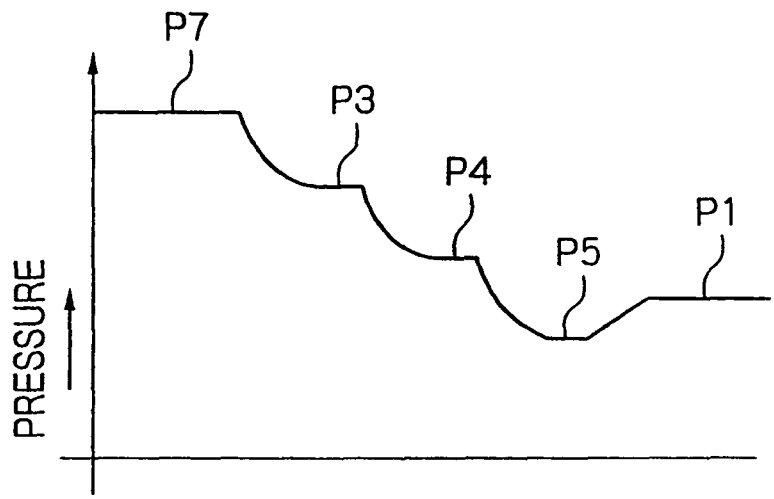
FIG. 15 is a graph indicating the pressure relationship with respect to a vacuum chamber, a chamber or space, and vacuum grooves of a differential vacuum seal device provided therebetween.

In FIG. 14, the parts or components of the substrate processing apparatus are substantially the same as those shown in FIG. 8, and are designated by the same reference numerals as used in FIG. 8. This substrate processing apparatus includes the stage device 31 having no rolling mechanism. The movable base 33 is supported, on one side, by the connecting member 16. In the passage 4 in which the connecting member 16 connecting the stage device 31 and the drive device 15 extends, there is provided the non-contacting seal device (differential exhausting seal device) 25. The non-contacting seal device 25 includes a plurality of (three in this embodiment) vacuum or exhausting grooves 26 formed in the inner circumferential surface of the wall 6 in the passage 4, which are individually connected to evacuation lines for performing evacuation at individual vacuum pressures P6-3, P6-2 and P6-1. The non-contacting type guide element [such as a static fluid pressure bearing (an air bearing)] 35 is provided in the passage 3a at a position adjacent to the non-contacting seal device 25 and on a side of the drive device 15, so as to provide non-contacting support of the connecting member 16 (and hence the movable base 33), and eliminate the problem of generation of dust. The non-contacting seal device 25 eliminates the problem of generation of dust in the seal portion, and the problem of reaction force and vibration produced by the seal device. The first vacuum chamber 1a is evacuated by means of the vacuum pump 18, such as an ion pump. The second space or chamber 7 separated from an ambient atmosphere by the cover 8 is connected to the evacuation line 45 which is controllably opened and closed by the control valve 46 and the dry gas feed line 47, which is controllably opened and closed by the control valve 48.

In the substrate processing apparatuses shown in FIGS. 13 and 14, when the non-contacting seal device is operated and the movable base of the stage device is moved linearly, the dry gas feed line 47 is controlled in cooperation with the evacuation line 45 so that the pressure P7 in the second chamber 7 becomes equal to or slightly higher than atmospheric pressure P0.

When the non-contacting seal device stops operating, the respective control valves 46 and 48 of the evacuation line 45 and the dry gas feed line 47 are closed, to thereby disconnect the second chamber 7 from the evacuation line 45 and the dry gas feed line 47. Consequently, only a gas in the space 7 of the pressure P7 flows into the first vacuum chamber 1a. In other words, the substrate in the first vacuum chamber 1a is confined to a limited space. The gas filling the space 7 of the pressure P7 comprises a dry gas (such as dry air, dry oxygen, dry nitrogen, dry helium, etc.), and therefore has an extremely low moisture content. Therefore, even when the gas in the space 7 flows into the first vacuum chamber 1, a time required for regenerating a vacuum is relatively short.

The control valve 46 may be replaced with a check valve which allows a gas flowing from the space 7 within the cover 8 to the outside area of the cover, but prevents the gas from flowing into the space. By using such a check valve, even if the pressure in the space becomes lower than the pressure in the outside area of the cover, the gas is prevented from flowing into the space.

In the substrate processing apparatuses shown in FIGS. 13 and 14, of the plurality of vacuum grooves 26 of the non-contacting seal device 25, the vacuum groove at pressure P6-1 is located closest to the first vacuum chamber 1a. In the third embodiment of the present invention, the pressure P6-1 is controlled to be lower than or equal to the pressure P1 in the first vacuum chamber 1a. By achieving this pressure relationship $P7 > P6\text{-}3 > P6\text{-}2 > P6\text{-}1 \leq P1$ as indicated in FIG. 11, it is possible to prevent a reverse flow or diffusion of gas from the vacuum system of the differential vacuum seal device 25 into the first vacuum chamber 1a.

As has been described above, the present invention has the following advantageous effects.

In the present invention, a gas feed line for feeding dry gas is connected to the sealing passage, and the timing of starting/stopping the feeding of dry gas through the gas feed line and the timing of starting/stopping evacuation through the evacuation lines connected to the first space and the sealing passage are controlled. By this arrangement, it is possible to prevent a considerable amount of gas from flowing from the second space having a low degree of cleanliness to the first space having a high degree of cleanliness. It is also possible to suppress deposition of water on an inner wall surface of the first space, which is required to have high cleanliness, thus reducing the time required for regenerating a vacuum.

In the present invention, the gas feed line may be connected to the sealing passage at a position between the second space and the evacuation line located closest to the second space. With this arrangement, a flow of gas from the second space having low cleanliness to the first space having high cleanliness can be effectively suppressed.

In the present invention, the seal device is started in a predetermined operating sequence as recited in claim 6, to thereby prevent a considerable amount of gas from flowing from the second space into the first space. Therefore, it is possible to prevent a lowering of cleanliness of the first space, which would otherwise result from a flow of gas from the second space having low cleanliness into the first space having high cleanliness. Further, it is possible to avoid a situation that due to a high humidity of the gas flowing into the first space, water is deposited on an inner wall surface of the first space thereby lowering the ultimate degree of vacuum. Further, it is possible to prevent clogging of the sealing passage which would otherwise result from entry of foreign matter contained in the second space into a small gap in the sealing passage.

In the present invention, the seal device is stopped in a predetermined operating sequence as recited in claim 7, to thereby prevent a considerable amount of gas from flowing from the second space into the first space. Therefore, it is possible to prevent a lowering of cleanliness of the first space, which would otherwise result from a flow of gas from the second space having low cleanliness into the first space having high cleanliness. Further, it is possible to avoid a situation where water is deposited on an inner wall surface of the first space due to a high humidity of the gas flowing into the first space. Therefore, a time required for reproducing a vacuum can be made relatively short. Further, it is possible to prevent the sealing passage from becoming clogged due to entry of foreign matter contained in the second space into a small gap in the sealing passage.

In the present invention, after stopping of the seal device, dry gas is fed through the gas feed line and a flow rate of the dry gas fed through the gas feed line is controlled so that a pressure at a gas feed port of the gas feed line formed in the sealing passage is maintained at a level equal to or higher than a pressure in the second space. By using this arrangement, it is possible to prevent a lowering of cleanliness of the first space due to a flow of gas from the second space having low cleanliness into the first space having high cleanliness. Further, it is possible to avoid deposition of water on an inner wall surface of the first space due to a high humidity of the gas flowing into the first space. Therefore, the time required for regenerating a vacuum can be made relatively short.

In the present invention, the dry gas fed through the gas feed line may comprise substantially the same components as air and have a humidity of 5% or less. With this arrangement, a problem of deposition of water on an inner wall surface of the first space does not arise. Further, workers can enter the second space without any difficulties.

In the substrate processing apparatus of the invention, it is possible to prevent a gas released from the drive device and a reverse flow or diffusion of gas from the vacuum system from being introduced into the first vacuum chamber in which a substrate is provided. Thus, cleanliness of the first vacuum chamber can be maintained at a satisfactory level. Therefore, the apparatus does not need frequent cleaning or maintenance.

In the substrate processing apparatus according to the invention, even when the non-contacting seal device stops operating, there is no gas flow from an external environment, such as a clean room, into the vacuum chamber. Thus, the substrate processing apparatus is able to adapt in a case that an emergency stop of the seal device occurs, and the time for regenerating a vacuum in the vacuum chamber can thus be reduced. Further, there is no need to increase a wall-thickness of a cover or a housing for a chamber so as to maintain a predetermined small gap in the non-contacting seal portion. Consequently, the apparatus can be reduced in size, and made lightweight in construction.

In the substrate processing apparatus according to the invention, it is possible to prevent a reverse flow or diffusion of gas from a vacuum system of the differential vacuum seal device, which would otherwise result in contamination of the first vacuum chamber. Consequently, cleanliness of the first vacuum chamber can be maintained at a satisfactory level, and the apparatus does not need frequent cleaning or maintenance.

Although the present invention has been described above in detail with reference to the drawings, the foregoing description is for explanatory purposes and not intended to limit characteristics. It should be understood that the foregoing description merely illustrates and explains preferred embodiments, and all modifications and changes within the scope of the spirit of the present invention are protected.

The entire disclosure of Japanese Patent Application No. 2002-103947 filed on Apr. 5, 2002 and No. 2002-254082 filed on Aug. 30, 2002 including specification, claims, drawings and summary is incorporated herein by reference in its entirety.

What is claimed is:

1. A method for operating a substrate processing apparatus comprising:
   a first chamber in which a stage device is provided and a substrate loaded on said stage device is processed; and
   a second chamber provided separately from said first chamber, a drive element for driving said stage device being provided in said second chamber,
   said first chamber being maintained in a vacuum, and a non-contacting seal device being provided between said first chamber and said second chamber,
   said second chamber being capable of being selectively connected to a supply source of dry gas, the non-contacting seal device being a differential vacuum seal device comprising a plurality of vacuum grooves being provided between said first chamber and said second chamber, wherein a gas feed line for feeding dry gas is connected to said seal device, wherein the degree of cleanliness of said first chamber and the degree of cleanliness of said second chamber are different, said first chamber having a high degree of cleanliness and said second chamber having a low degree of cleanliness, said gas feed line is connected to said seal device at a position between said second chamber and said vacuum groove located closest to said second chamber, and a non-contacting type guide element is provided at a position adjacent to the non-contacting seal device and on a side of the drive device, the method comprising:
   controlling a pressure in said second chamber to be equal to or approximate to atmospheric pressure by supplying and discharging the dry gas, and
   making, of said plurality of vacuum grooves of said differential vacuum seal device, the vacuum groove which is located closest to said first chamber have an internal pressure lower than or equal to a pressure in said first chamber,
   wherein when the non-contacting seal device stops operating, the respective control valves of an evacuation line and the dry gas feed line are closed, to thereby disconnect the second chamber from the evacuation line and the dry gas feed line.

2. The method according to claim 1, wherein said first chamber and said second chamber are communicated through a passage in which a plurality of spaced exhausting grooves of said non-contacting seal device are formed.

3. The method according to claim 2, wherein a member connecting the stage device disposed in said first chamber and the drive element disposed in said second chamber extends through said passage.

4. The method according to claim 1, wherein said differential vacuum seal device is disposed in a passage communicating said first chamber with said second chamber, and a member connecting said stage device and said drive element extends through said passage.

5. A method for operating a substrate processing apparatus comprising:
   a first chamber in which a stage device is provided and a substrate loaded on said stage device is processed; and a second chamber provided separately from said first chamber, a drive element for driving said stage device being provided in said second chamber, said first chamber being maintained in a vacuum, and a non-contacting seal device being provided between said first chamber and said second chamber, the non-contacting seal device being a differential vacuum seal device comprising a plurality of vacuum grooves being provided between said first chamber and said second chamber, said second chamber being capable of being selectively connected to a supply source of dry gas, wherein a gas feed line for feeding dry gas is connected to said seal device, wherein the degree of cleanliness of said first chamber and the degree of cleanliness of said second chamber are different, said first chamber having a high degree of cleanliness and said second chamber having a low degree of cleanliness, said gas feed line is connected to said seal device at a position between said second chamber and said vacuum groove located closest to said second chamber, and a non-contacting type guide element is provided at a position adjacent to the non-contacting seal device and on a side of the drive device, the method comprising:

when said non-contacting seal device is operated while said stage device is being driven, controlling a pressure in said second chamber to be equal to or approximate to atmospheric pressure by supplying and discharging the dry gas, and when said non-contacting seal device is not operated, disconnecting said second chamber from said supply source of dry gas, and stopping discharge of the gas from said second chamber.

6. The method according to claim 5, wherein said first chamber and said second chamber are communicated through a passage in which a plurality of spaced exhausting grooves of said non-contacting seal device are formed.

7. The method according to claim 6, wherein a member connecting the stage device disposed in said first chamber and the drive element disposed in said second chamber extends through said passage.

* * * * *